(12) United States Patent
Shin

(10) Patent No.: US 9,110,110 B2
(45) Date of Patent: Aug. 18, 2015

(54) BIDIRECTIONAL 3 PHASE POWER METER FOR COMPENSATING REVERSE LOAD FLOW AND METHOD FOR METERING THEREBY

(75) Inventor: Dong-Yeol Shin, Daejeon (KR)

(73) Assignee: KOREA ELECTRIC POWER CORPORATION, Seoul (KR)

(*) Notice: Subject to any disclaimer, the term of this patent is extended or adjusted under 35 U.S.C. 154(b) by 1371 days.

(21) Appl. No.: 12/884,705

(22) Filed: Sep. 17, 2010

(65) Prior Publication Data
US 2011/0241655 A1    Oct. 6, 2011

(30) Foreign Application Priority Data

Apr. 2, 2010    (KR) .................. 10-2010-0030568

(51) Int. Cl.
*G01R 19/10* (2006.01)
*G01R 21/133* (2006.01)

(52) U.S. Cl.
CPC .................. *G01R 21/1331* (2013.01)

(58) Field of Classification Search
CPC .................................. G01R 21/1331

USPC .............................. 702/60; 324/140
See application file for complete search history.

(56) References Cited

U.S. PATENT DOCUMENTS

| | | | | |
|---|---|---|---|---|
| 3,525,904 A | * | 8/1970 | Ringstad | 361/82 |
| 4,058,768 A | * | 11/1977 | Milkovic | 324/142 |
| 4,945,304 A | * | 7/1990 | Feron | 324/107 |
| 5,673,196 A | * | 9/1997 | Hoffman et al. | 702/65 |
| 5,822,165 A | * | 10/1998 | Moran | 361/78 |
| 6,828,771 B1 | * | 12/2004 | Ghassemi | 324/142 |
| 2010/0235144 A1 | * | 9/2010 | Mosberger-Tang | 702/188 |

* cited by examiner

*Primary Examiner* — Andrew Schechter
*Assistant Examiner* — Peter Ngo
(74) *Attorney, Agent, or Firm* — McDermott Will & Emery LLP

(57) ABSTRACT

The present invention relates to a bidirectional 3 phase power meter for compensating reverse load flow and a method for metering thereby. According to the present invention, there is provided a bidirectional 3 phase power meter for compensating reverse load flow which allows calculating power receiving and power transmitting apparent power and power factor using the detected voltage/current and a method for metering thereby.

25 Claims, 51 Drawing Sheets

BIDIRECTIONAL 3 PHASE POWER METER FOR COMPENSATING REVERSE LOAD FLOW AND METHOD FOR METERING THEREBY

CROSS-REFERENCE TO RELATED APPLICATIONS

This application claims the benefit of Korean Patent Application No. 10-2010-0030568 filed on Apr. 2, 2010, with the Korea Intellectual Property Office, the contents of which are incorporated here by reference in their entirety.

BACKGROUND

1. Technical Field

The present invention relates to a bidirectional 3 phase power meter for compensating reverse load flow and a method for metering thereby.

2. Background

Problems metering excessively or insufficiently have been caused due to a reverse load flow phenomenon in a power provider's system, regardless of used power by a user or generated power.

Here, the reverse load flow refers to a energy that flows from the load side to the source side, and is a ground source supplied through the neutral line in a Yg-Δ connection type. Generally, no reverse load flow occurs in a Δ-Y connection type a receiving transformer, but the Yg-Δ connection type is a common connection of an interconnection transformer of DGs(Distributed Power Generation).

Especially, such a reverse load flow phenomenon severely occurs in a transmission and distribution power system interconnected with distributed power occurrence such as photovoltaic power occurrence, wind power occurrence and the like, which causes an error therefore, regardless of accuracy of a power meter.

A power meter calculates the price based on maximum power, active power usage, and power factor. A calculation zone of a power meter is the region where a reactive power region is overlapping to an active power region.

In the reactive power region, there are various kinds of var-hour (reactive power) meters as 0 to 180° region is a lagging reactive power zone, 60 to −120° region is a lagging and leading reactive power zone, and 90 to −90° region is a lagging and leading zone. For example, a reactive power meter of the lagging zone of 0 to 180° does not meter the leading reactive power. However, the leading reactive power is metered during the power transmission and this causes an error when power factor is calculated. In the 60 to −120° region, the leading power and the lagging power are metered at the same time but the region above 60° cannot be metered. Therefore, it is the most apparent that the active power region and the reactive power region be overlapped as in the calculating zone.

In general, a power receiving consumer uses Δ-Y wiring method for an interconnection transformer and a power transmitting consumer uses Yg-Δ wiring method. A general load flow direction of a power receiving consumer is the direction from a power provider to a power user and a load flow direction of a power transmitting consumer is the direction from a power user to a power provider. When load flow per phase, unlike identical 3 phase load flow, is mixed in a direction from a power supply side to a load side or from a load side to a power supply side, a measurement error may occure because load unbalance in a power system occurs due to a wiring method of the interconnection transformer and a load flow direction of one phase among 3 phases is thus changed which is called as reverse load flow. This problem usually occurs in the power transmitting side but it sometimes occurs in the power receiving side due to a wiring system of the interconnection transformer.

A conventional power transmitting side installs a power receiving power meter and a power transmitting power meter and calculates amount of power receiving power and amount of power transmitting power, respectively. Here, in the power receiving state, a power receiving power meter operates and in the power transmitting state, a power transmitting power meter operates. However, in the reverse load flow state, since a reverse load flow is occurred in a power provider's system, a power receiving power meter and a power transmitting power meter cause extremes errors.

The power transmitting power meter has identical structure to the power receiving power meter and a bidirectional power meter measuring for both power transmitting and power receiving uses by combining two of a one way metering system.

SUMMARY

The present invention is to provide a bidirectional 3 phase power meter for compensating reverse load flow and a method for metering thereby to increase reliability of power metering between a power provider and a power user when a reverse load flow occurs due to a system.

The present invention is to provide a bidirectional 3 phase power meter for compensating reverse load flow and a method for metering thereby to measure power transmitting/receiving usage, except for reverse load flow when a reverse load flow occurs due to a power system irrelevant to power equipments.

According to an aspect of the invention, there is provided a bidirectional 3 phase power meter for compensating reverse load flow including: a voltage/current detecting unit detecting a voltage or current per phase; a bidirectional measuring unit measuring power receiving direction or power transmitting direction by calculating phase difference per phase using the detected voltage per phase or current per phase and calculating neutral line current; an instantaneous power calculating unit calculating instantaneous power by using the voltage per phase, the current per phase and the phase difference per phase; a reverse load flow determining unit determining occurrence of reverse load flow through the phase difference per phase and the neutral line current calculated from the bidirectional measuring unit; a reverse load flow calculating unit calculating reverse load flow power generated when the reverse load flow determining unit determines occurrence of reverse load flow; an actual power usage calculating unit calculating actual power usage by calculating instantaneous compensation power per phase and 3 phase instantaneous compensation power using the instantaneous power and the reverse load flow power; a power transmitting/receiving direction determining unit determining active power or reactive power of the actual power usage; a power meter value storing unit compensating the amount of active power and reactive power calculated from the power transmitting/receiving direction determining unit, and accumulating and storing the result; and an apparent power/power factor calculating unit calculating apparent power and power factor using the active power and reactive power stored at the power meter value storing unit and the amount of accumulated power.

The bidirectional measuring unit may further include a power receiving direction measuring unit; and a power transmitting direction measuring unit, in which the power receiving direction measuring unit determines phase by subtracting the phase of the current per phase from the phase of the voltage per phase, and the power transmitting direction measuring unit determines phase by adding 180° to the phase determined at the power receiving direction measuring unit.

The bidirectional measuring unit may further include a neutral line current measuring unit measuring the neutral line current by calculating 3 phase current vector sum.

The instantaneous power calculating unit may further include a power receiving instantaneous power calculating unit calculating power receiving direction instantaneous power; and a power transmitting instantaneous power calculating unit calculating power transmitting direction instantaneous power.

The power receiving instantaneous power calculating unit may further include an instantaneous active power calculating unit calculating instantaneous active power per phase; and an instantaneous reactive power calculating unit calculating instantaneous reactive power per phase.

The reverse load flow determining unit may further include: a negative-sequence selecting unit selecting a negative-sequence based on a smaller value from a positive-sequence and a negative-sequence; a current intensity comparing unit outputting 0 or 1 by comparing a negative-sequence intensity outputted from the negative-sequence selecting unit with a zero-sequence intensity; a plurality of voltage phase difference comparing units outputting 0 or 1 by comparing phase difference of voltages per phase; a first AND gate outputting 1 in the case in which all outputs of the voltage phase difference comparing unit are 1 and outputting 0 in the rest of the case; and a second AND gate outputting 1 in the case in which all outputs of the current intensity comparing unit and the first AND gate are 1.

The reverse load flow calculating unit may further include: a power receiving reverse load flow calculating unit calculating power receiving direction reverse load flow power; and a power transmitting reverse load flow calculating unit calculating power transmitting direction reverse load flow power.

The reverse load flow calculating unit may further include: an active reverse load flow calculating unit calculating active power of the reverse load flow power per phase; and a reactive reverse load flow calculating unit calculating reactive power of the reverse load flow power per phase.

The actual power usage calculating unit may further include: a power receiving actual power usage calculating unit calculating power receiving direction instantaneous compensation power per phase and 3 phase instantaneous compensation power; and a power transmitting actual power usage calculating unit calculating power transmitting direction instantaneous compensation power per phase and 3 phase instantaneous compensation power.

The power receiving actual power usage calculating unit or the power transmitting actual power usage calculating unit may further include: an instantaneous compensation active power per phase calculating unit calculating instantaneous compensation active power per phase; an instantaneous compensation reactive power per phase calculating unit calculating instantaneous compensation reactive power per phase; a 3 phase instantaneous compensation active power calculating unit calculating 3 phase instantaneous compensation active power; and a 3 phase instantaneous compensation reactive power calculating unit calculating 3 phase instantaneous compensation reactive power.

The instantaneous compensation active power per phase calculating unit may calculate a compensation value by subtracting reverse load flow instantaneous active power per phase from instantaneous active power per phase.

The instantaneous compensation reactive power per phase calculating unit may calculate a compensation value by subtracting reverse load flow instantaneous reactive power per phase from instantaneous reactive power per phase.

The 3 phase instantaneous compensation active power calculating unit may calculate by a vector addition of instantaneous active power per phase compensated at the same point per phase.

The 3 phase instantaneous compensation reactive power calculating unit may calculate by a vector addition of instantaneous reactive power per phase compensated at the same point per phase.

The power transmitting/receiving direction determining unit may further include an active power determining unit determining active power of the actual power usage of the power transmitting direction or power receiving direction, and a reactive power determining unit determining reactive power of the actual power usage.

The active power determining unit may output 0 if the sum of the compensated active power value per phase and compensated the 3 phase active power value is equal to or smaller than 0, and may output the sum of the compensated active power value per phase and the compensated 3 phase active power value if it is higher than 0.

The active power determining unit may output an output value if the sum of 3 phase active power values is smaller than 0 and the sum of active power values per phase is higher than 0.

The active power determining unit may determine –active power if active power per phase is higher than a measuring range in the case in which 3 phase active power is the power receiving direction.

The reactive power determining unit may determine a reactive power value if a compensation active power value per phase is higher than 0 and active power of the power receiving direction is then determined, and output 0 for a reactive power value if an active power value is smaller than 0 based on the compensation active power value per phase.

The reactive power determining unit may determine lagging reactive power or leading reactive power, in which it may select the lagging reactive power if the compensated reactive power per phase and 3 phase reactive power is higher than 0 and it does the leading reactive power if it is smaller than 0.

The power meter value storing unit may further include a power usage integrating unit integrating active power or reactive power selected from the power transmitting/receiving direction determining unit with time.

According to another aspect of the invention, there is provided a method for metering by a 3 phase bidirectional power meter for compensating reverse load flow, including: (a) detecting voltage or current per phase by using voltage value and current value inputted from a sensor; (b) measuring neutral line current and each phase difference per phase of the power transmitting/receiving direction by using the detected voltage value and current value per phase; (c) determining reverse load flow by using the measured each phase difference per phase and the neutral line current; (d) calculating reverse load flow power when it is determined for the occurrence of the reverse load flow; (e) calculating instantaneous power by employing an instantaneous power calculating function of the each voltage per phase, the each current per phase and the phase difference; (f) calculating actual power usage by calculating instantaneous compensation power per phase and 3 phase instantaneous compensation power through the instantaneous power and the reverse load flow power; (g) determining active power of the actual power usage; (h) determining reactive power of the actual power usage; (i) measuring and storing amount of active power or reactive power according to the determined active power or reactive power; and (j) calculating apparent power or power factor using the measured active power or reactive power amount.

The step (b) may include determining power receiving direction by subtracting the phase of the current per phase from the phase of the voltage per phase; and determining power transmitting direction by adding 180° to the determined power receiving direction.

The step (b) may include determining the neutral line current by calculating 3 phase current vector sum and calculating 3 phase current with positive-sequence, negative-sequence, and zero-sequence.

The step (c) may include outputting 1 if the zero-sequence is higher than the negative-sequence when intensity of the negative-sequence is compared with that of the zero-sequence and outputting 0 if it is equal to or smaller.

The step (a) may further include transforming the detected voltage per phase and the detected current per phase into discrete signal by sampling; and calculating non-sinusoidal wave power by dividing the voltage per phase and the current per phase which are transformed into the discrete signal, into the intensity and phase for each degree and DC component by employing the fast Fourier transform.

In the step of (g), per-phase instantaneous powers at a same point are added, and if the three-phase-added value is greater than 0, the power per phase and three-phase power can be accumulated in a power-receiving direction. Furthermore, if the three-phase-added value is less than 0, the power per phase and three-phase power can be accumulated in a power-transmitting direction.

The step (h) may further include adding reactive power per phase compensated at the same point per phase.

The step (h) may further include determining as lagging reactive power if the compensated instantaneous reactive power per phase and the compensated 3 phase reactive power is higher than 0 and determining as leading reactive power if it is smaller than 0.

The step (i) may further include storing each of the compensated active power and reactive power according to power receiving direction and power transmitting direction.

According to the exemplary embodiment of the present invention, it allows measuring accurate power usage actually used by a user by compensating errors caused by reverse load flow in a power system and controlling peaks and power factor by using compensated active/reactive power per phase.

In addition, according to the exemplary embodiment of the present invention, it allows checking metered values per phase in case of absent phase or absent line errors of PT or CT per phase.

DETAILED DESCRIPTION

While the present invention has been described with reference to particular embodiments, it is to be appreciated that various changes and modifications may be made by those skilled in the art without departing from the spirit and scope of the present invention, as defined by the appended claims and their equivalents.

Throughout the description of the present invention, when describing a certain technology is determined to evade the point of the present invention, the pertinent detailed description will be omitted. While such terms as "first" and "second," etc., may be used to describe various components, such components must not be limited to the above terms. The above terms are used only to distinguish one component from another.

The bidirectional 3 phase power meter for compensating reverse load flow and the method for metering thereby according to certain embodiments of the invention will be described below in more detail with reference to the accompanying drawings.

Figure 1:
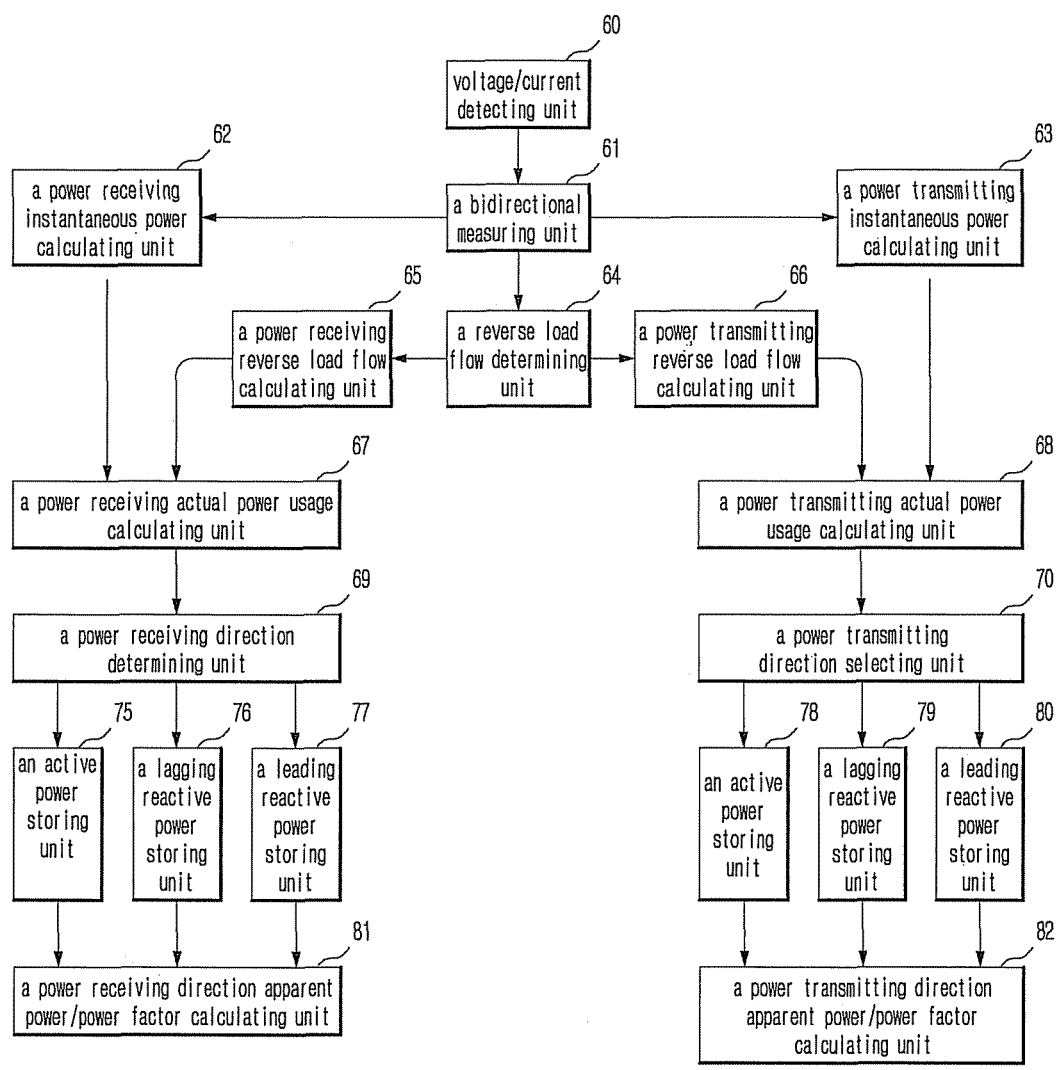
FIG. 1 is a schematic block view illustrating a bidirectional 3 phase power meter for compensating reverse load flow according to an embodiment of the present invention.

FIG. 1 is a schematic block view illustrating a bidirectional 3 phase power meter for compensating reverse load flow according to an embodiment of the present invention.

According to FIG. 1, a bidirectional 3 phase power meter for compensating reverse load flow may include a voltage/ current detecting unit 60, a bidirectional measuring unit 61, a power receiving instantaneous power calculating unit 62, a power transmitting instantaneous power calculating unit 63, a reverse load flow determining unit 64, a power receiving reverse load flow calculating unit 65, a power transmitting reverse load flow calculating unit 66, a power receiving actual power usage calculating unit 67, a power receiving direction determining unit 69, an active power storing unit 75, a lagging reactive power storing unit 76, a leading reactive power storing unit 77, a power receiving direction apparent power/power factor calculating unit 81, a power transmitting actual power usage calculating unit 68, a power transmitting direction determining unit 70, an active power storing unit 78, a lagging reactive power storing unit 79, a leading reactive power storing unit 80 and a power transmitting direction apparent power/power factor calculating unit 82.

Figure 2:
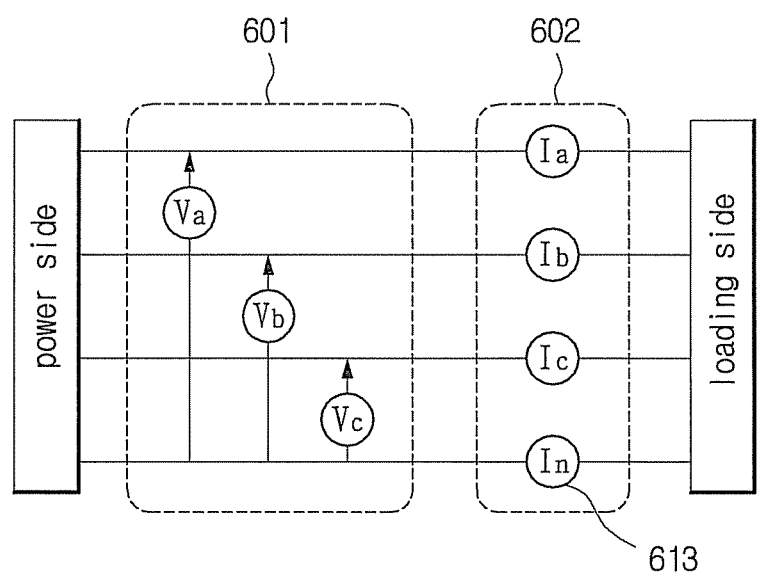
FIG. 2 and FIG. 3 are schematic block views illustrating a voltage/current detecting unit in FIG. 1.
Figure 3:
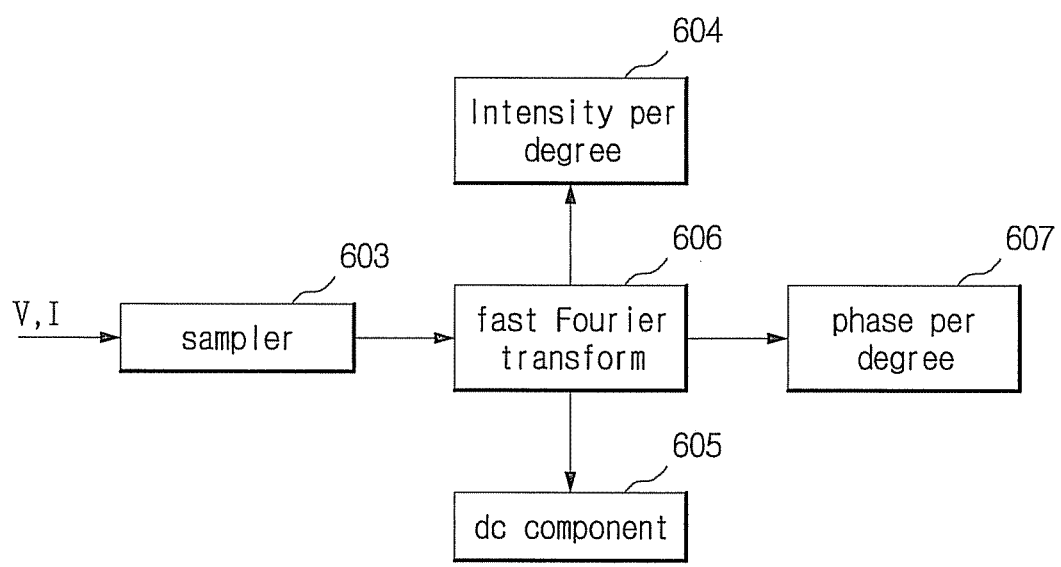
Figure 4:
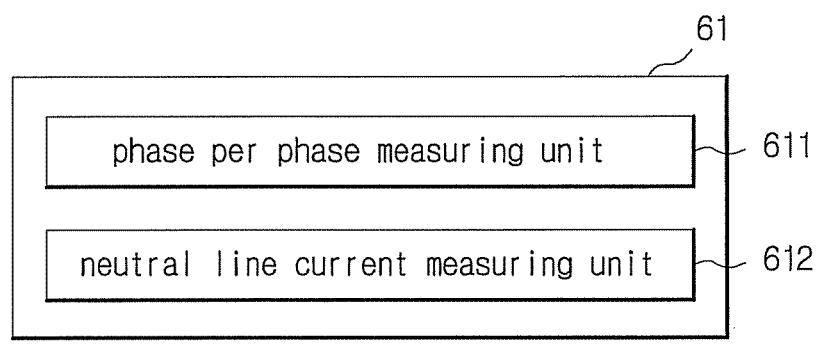
FIG. 4 to FIG. 7 are schematic drawings illustrating a bidirectional measuring unit in FIG. 1.
Figure 5:
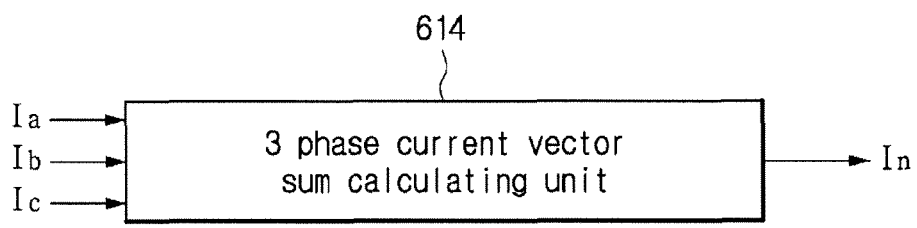
Figure 5:
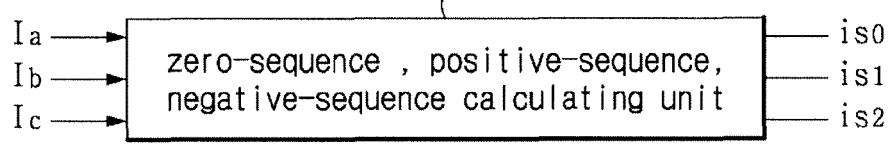

Particularly, the voltage/current detecting unit 60 may detect voltage/current per phase by using a detecting sensor such as potential transformer 601 (PT) and current transformer 602 (CT) and the like. As shown in FIG. 2, the potential transformer 601 may be arranged between a power supply side and a load side and between a neutral line and each power line per phase to detect each voltage per phase.

In the potential transformer 601, + side of voltage per phase Va, Vb, Vc may be connected to a voltage line per phase and − side is connected to a neutral line based on polarity of the voltage and current per phase.

The current transformer 602 may be arranged in parallel between the power supply side and the load side to detect each current per phase. In the current transformer 602, a determination reference of current per phase Ia, Ib, Ic is that + side is a power supply side and − side is a load side.

Signals of the detected voltage and current per phase, which are continuous signals, are converted to discrete signals at a sampler 603 and further divided into intensity per degree 604, phase per degree 607, DC component 605 at a fast Fourier transform unit 606 to calculate non-sinusoidal wave power. The non-sinusoidal wave power may be determined by dividing into a fundamental component, a harmonic component, a DC component through the fast Fourier transform (FFT). The present invention will describe for the fundamental component, not for the harmonic component and the DC component since only a fundamental component is generated due to a reverse load flow phenomenon caused by an interconnection transformer in embodiments of the present invention.

The bidirectional measuring unit 61 may measure neutral line current and phase angle of the power transmitting/receiving direction by using the voltage and current determined at the voltage and current detecting unit 60. As shown in FIG. 4 to FIG. 7, the bidirectional measuring unit 61 may include a phase per phase measuring unit 611 and a neutral line current measuring unit 612.

Figure 6:
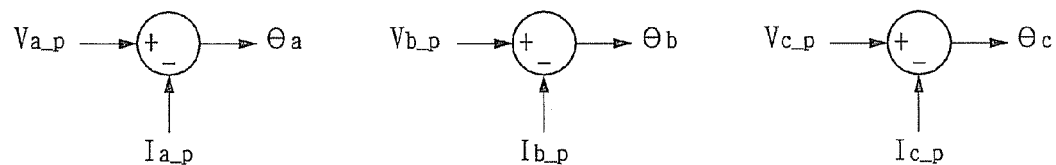
Figure 7:
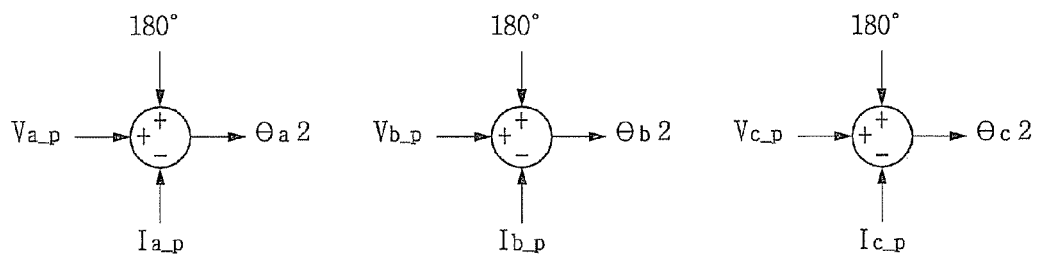

The phase per phase measuring unit 611 may measure phase angle per phase $\theta a$, $\theta b$, $\theta c$ by subtracting phase of current per phase Ia_p, Ib_p, Ic_p from phase of voltage per phase Va_p, Vb_p, Vc_p as shown in FIG. 6 to determine phase angle of the power receiving direction. Further, the phase per phase measuring unit 611 may measure the power transmitting direction based on phase angle $\theta a2$, $\theta b2$, $\theta c2$ by adding 180° to the phase difference of the power receiving direction as shown in FIG. 7.

The neutral line current measuring unit may measure current of the neutral line which is vector sum of current per phase Ia, Ib, Ic calculated at a 3 phase current vector sum calculating unit 614. Here, the current of the neutral line may be determined by one method chosen from the following methods: (i) dividing 3 phase current into a positive-sequence, a negative-sequence and a zero-sequence using the method of symmetrical coordinates 615; (ii) indirectly determining 3 phase current inside the power meter; and (iii) directly determining current of primary neutral line of an interconnection transformer.

Figure 8:
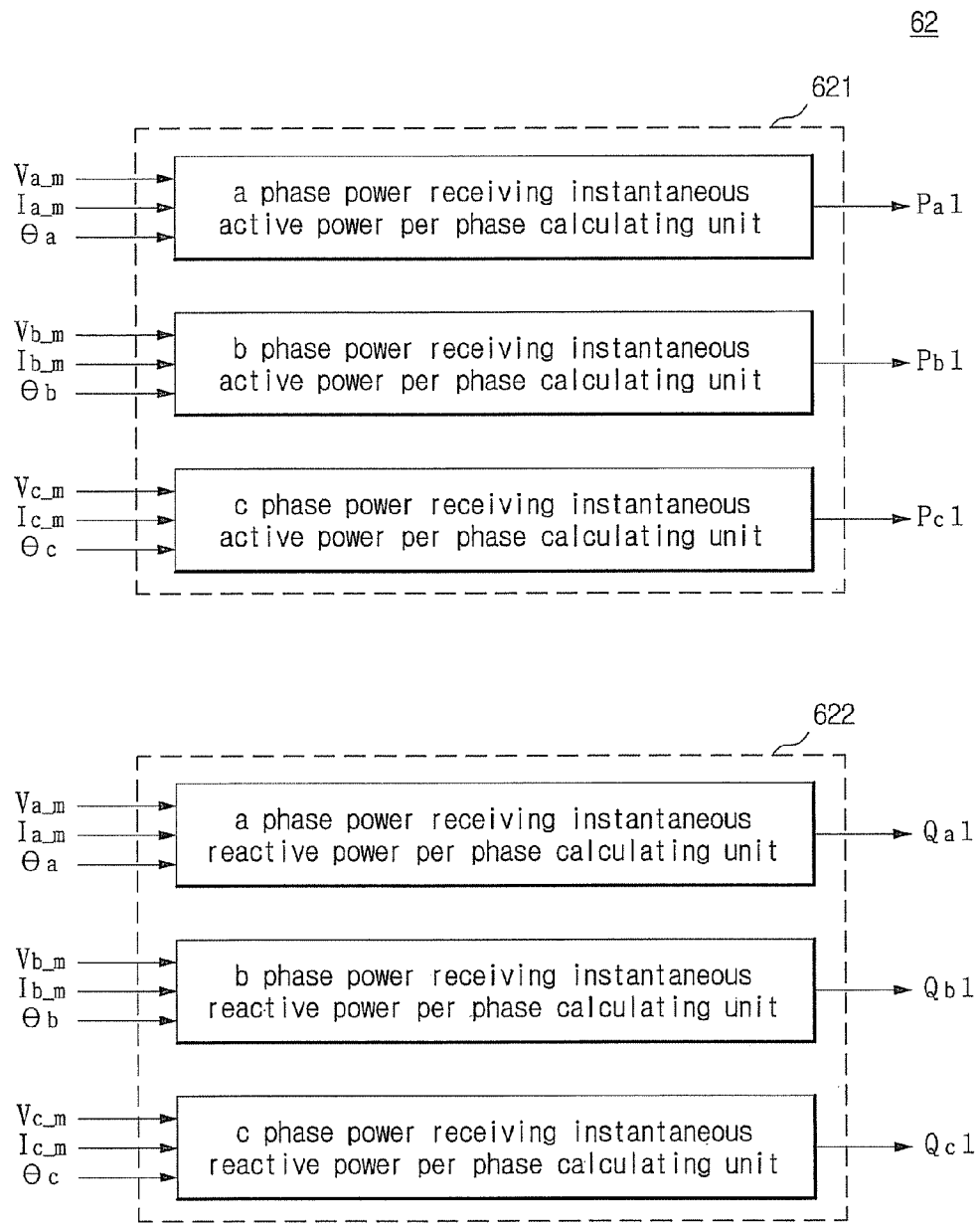
FIG. 8 is a block view illustrating a power receiving instantaneous power calculating unit according to an embodiment of the present invention.

A power receiving instantaneous power calculating unit 62 may calculate instantaneous power of the power receiving direction. Here, the power receiving instantaneous power calculating unit 62 may include a power receiving instantaneous active power per phase calculating unit 621 and a power receiving instantaneous reactive power per phase calculating unit 622 as shown in FIG. 8.

The power receiving instantaneous active power per phase calculating unit 621 may calculate by employing functions for calculating active power of Equation 1 to Equation 3:

$$Pa1 = Va\_m * Ia\_m * \cos\theta a \qquad \text{Equation 1}$$

(Pa1 is active power of a phase, Va_m is voltage of a phase, Ia_m is current of a phase, $\theta a$ is phase angle);

$$Pb1 = Vb\_m * Ib\_m * \cos\theta b \qquad \text{Equation 2}$$

(Pb1 is active power of b phase, Vb_m is voltage of b phase, Ib_m is current of b phase, $\theta b$ is phase angle); and $$Pc1 = Vc\_m * Ic\_m * \cos\theta c \qquad \text{Equation 3}$$

(Pc1 is active power of c phase, Vc_m is voltage of c phase, Ic_m is current of c phase, $\theta c$ is phase angle).

The power receiving instantaneous reactive power per phase calculating unit 622 may calculate by employing functions for calculating reactive power of Equation 4 to Equation 6:

$$Qa1 = Va\_m * Ia\_m * \sin\theta a \qquad \text{Equation 4}$$

(Qa1 is reactive power of a phase, Va_m is voltage of a phase, Ia_m is current of a phase, $\theta a$ is phase angle);

$$Qb1 = Vb\_m * Ib\_m * \sin\theta b \qquad \text{Equation 5}$$

(Qb1 is reactive power of b phase, Vb_m is voltage of b phase, Ib_m is current of b phase, $\theta b$ is phase angle); and $$Qc1 = Vc\_m * Ic\_m * \sin\theta c \qquad \text{Equation 6}$$

(Qc1 is reactive power of c phase, Vc_m is voltage of c phase, Ic_m is current of c phase, $\theta c$ is phase angle).

The power receiving instantaneous power calculating unit 62 can calculate instantaneous active power and reactive power per phase of the power receiving direction as in Equations 1 to 6.

Figure 9:
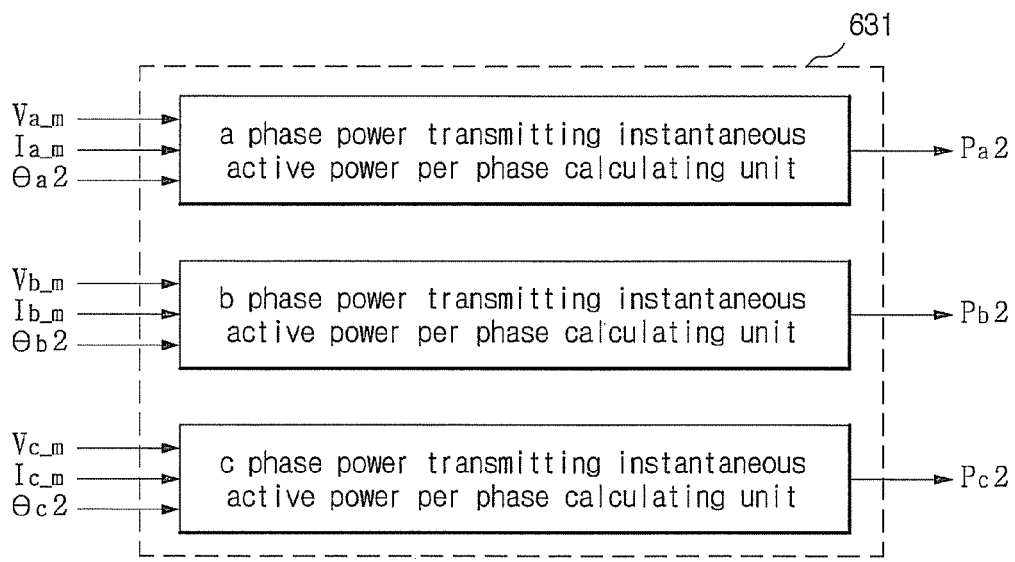
FIG. 9 is a block view illustrating a power transmitting instantaneous power according to an embodiment of the present invention.
Figure 9:
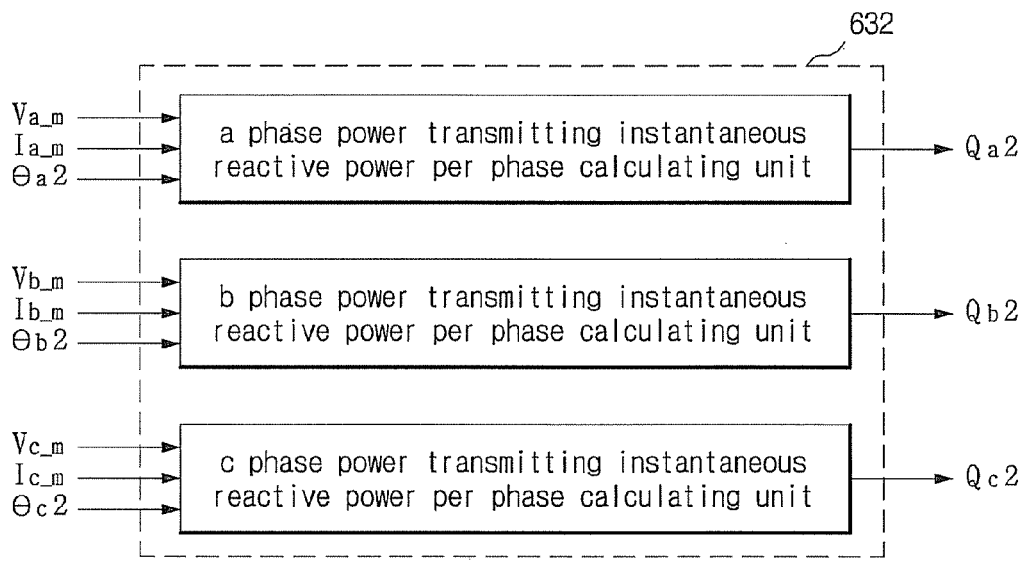

The power transmitting instantaneous power calculating unit 63 can calculate instantaneous power of the power transmitting direction. Here, the power transmitting instantaneous power calculating unit 63 may include a power transmitting instantaneous active power per phase calculating unit 631 and a power transmitting instantaneous reactive power per phase calculating unit 632 as shown in FIG. 9.

The power transmitting instantaneous active power per phase calculating unit 631 may calculate by employing functions for calculating active power of Equation 7 to Equation 9:

$$Pa2 = Va\_m * Ia\_m * \cos\theta a2 \qquad \text{Equation 7}$$

(Pa2 is active power of a phase, Va_m is voltage of a phase, Ia_m is current of a phase, $\theta a2$ is phase angle);

$$Pb2 = Vb\_m * Ib\_m * \cos\theta b2 \qquad \text{Equation 8}$$

(Pb2 is active power of b phase, Vb_m is voltage of b phase, Ib_m is current of b phase, $\theta b2$ is phase angle); and $$Pc2 = Vc\_m * Ic\_m * \cos\theta c2 \qquad \text{Equation 9}$$

(Pc2 is active power of c phase, Vc_m is voltage of c phase, Ic_m is current of c phase, θc is phase angle).

The instantaneous reactive power per phase calculating unit of the power transmitting direction 632 may calculate by employing functions for calculating reactive power of Equation 10 to Equation 12:

$$Qa2 = Va\_m * Ia\_m * \sin \theta a2 \qquad \text{Equation 10}$$

(Qa2 is reactive power of a phase, Va_m is voltage of a phase, Ia_m is current of a phase, θa2 is phase angle);

$$Qb2 = Vb\_m * Ib\_m * \sin \theta b2 \qquad \text{Equation 11}$$

(Qb1 is reactive power of b phase, Vb_m is voltage of b phase, Ib_m is current of b phase, θb2 is phase angle); and $$Qc2 = Vc\_m * Ic\_m * \sin \theta c2 \qquad \text{Equation 12}$$

(Qc2 is reactive power of c phase, Vc_m is voltage of c phase, Ic_m is current of c phase, θc2 is phase angle).

The power transmitting instantaneous power calculating unit 63 can calculate instantaneous active power and reactive power per phase of the power transmitting direction as in Equations 7 to 12.

The reverse load flow determining unit 64 may determine whether to compensate for reverse load flow by comparing the intensity of a load current when the reverse load flow is caused in a power system. Further, the reverse load flow determining unit 64 may determine each reverse load flow of the power receiving direction and the power transmitting direction.

Figure 10:
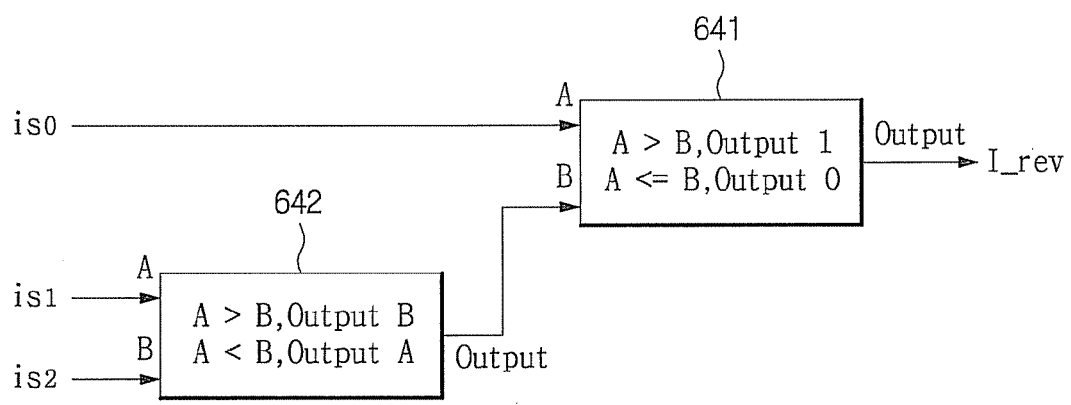
FIG. 10 to FIG. 12 are block views illustrating an example of a reverse load flow determining unit in FIG. 1.
Figure 11:
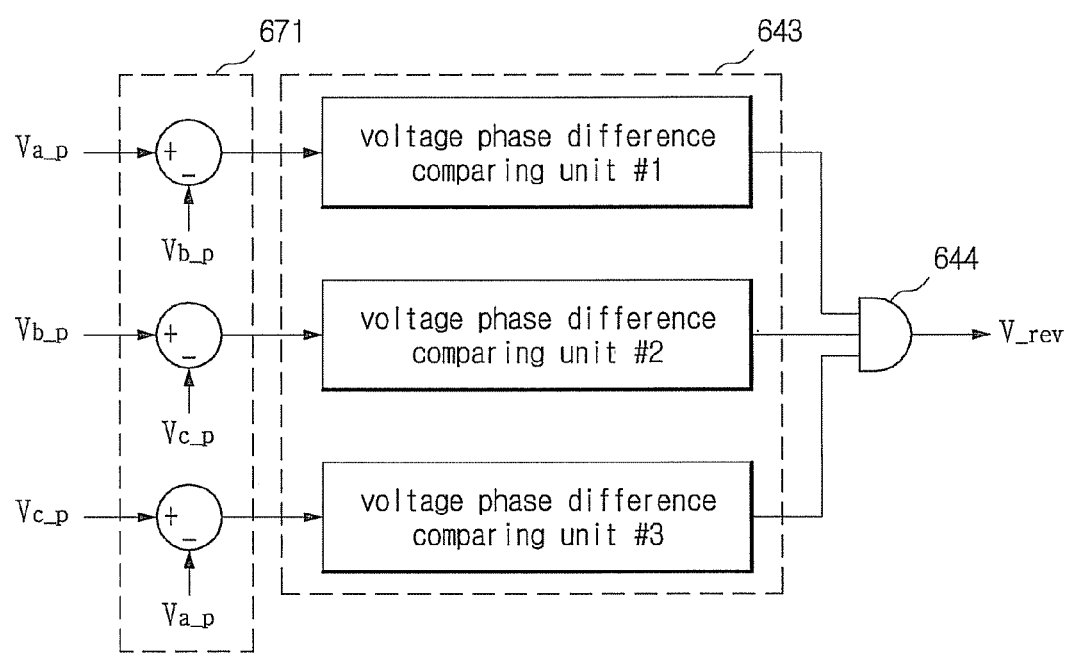
Figure 12:
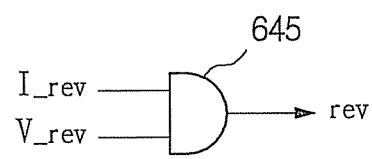
Figure 13:
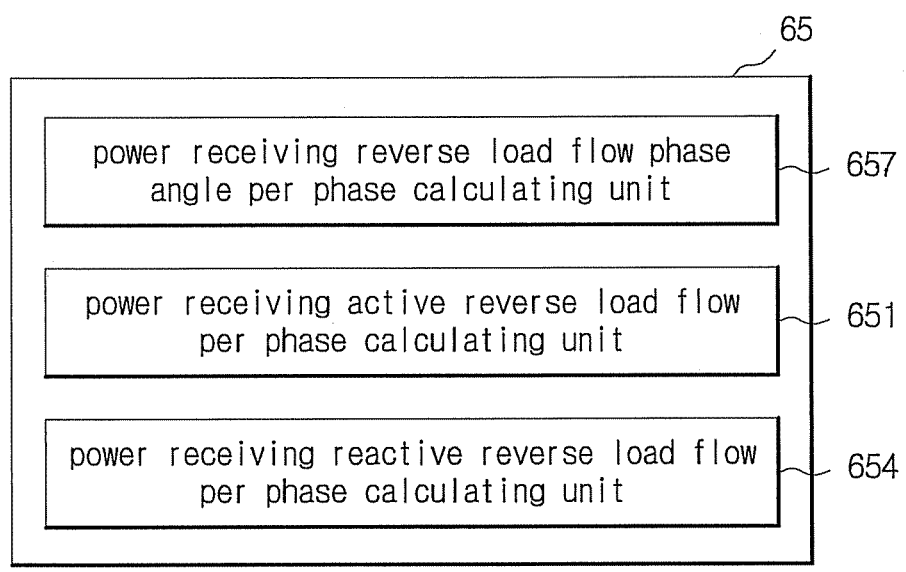
FIG. 13 to FIG. 16 are block views illustrating an example of a power receiving reverse load flow determining unit in FIG. 1.
Figure 14:
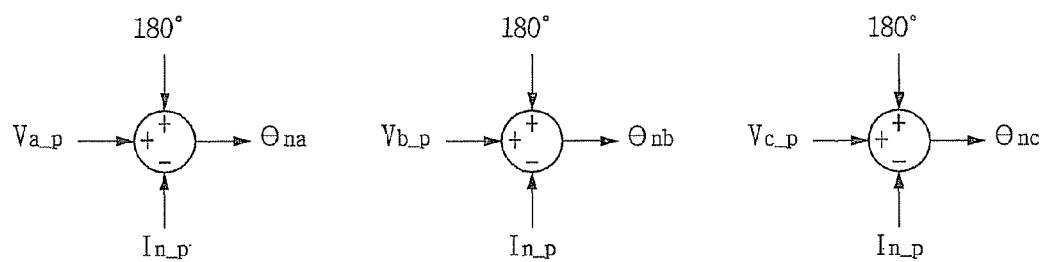
Figure 15:
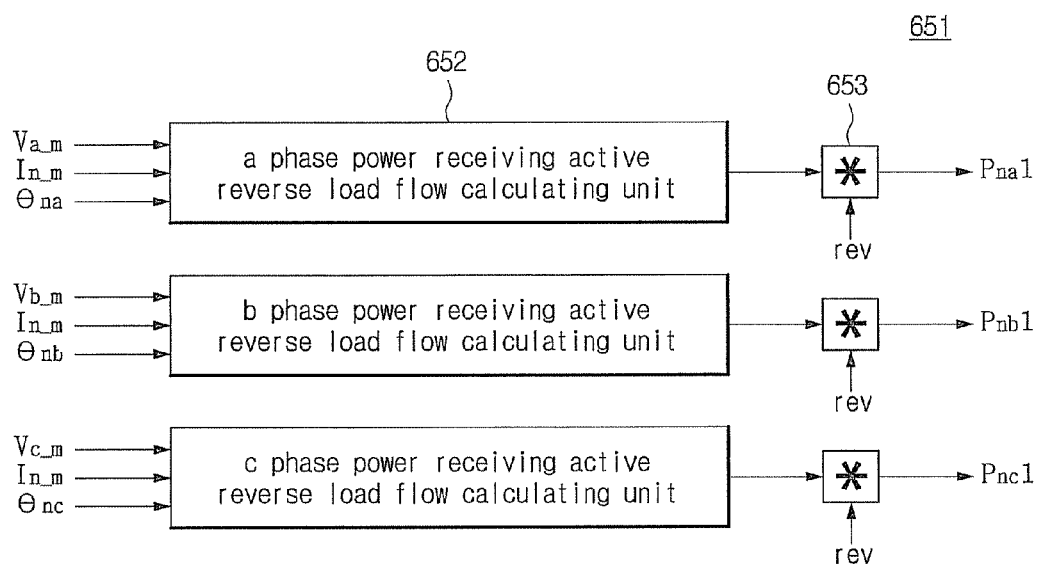
Figure 16:
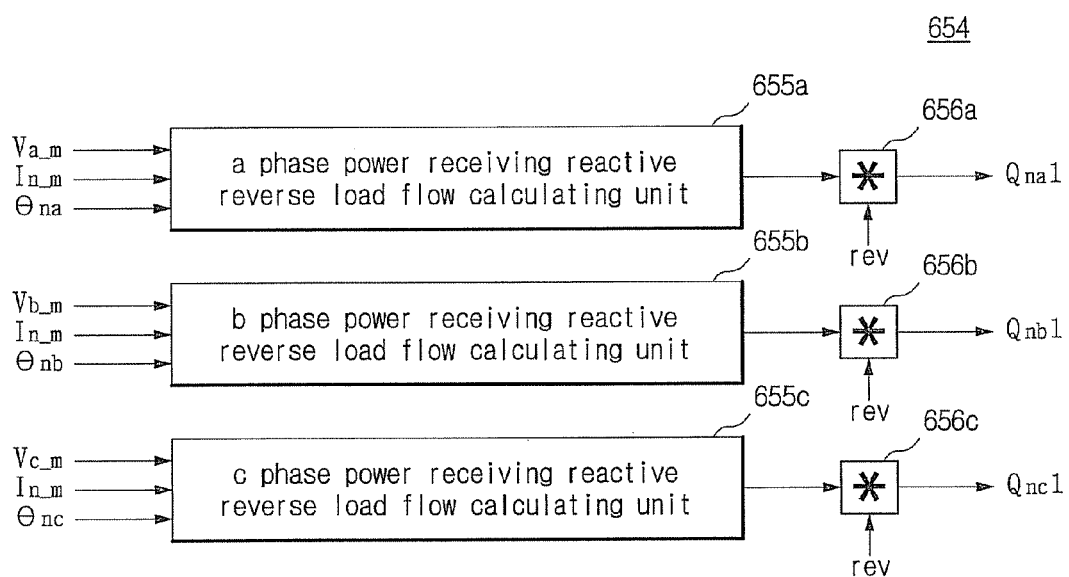
Figure 17:
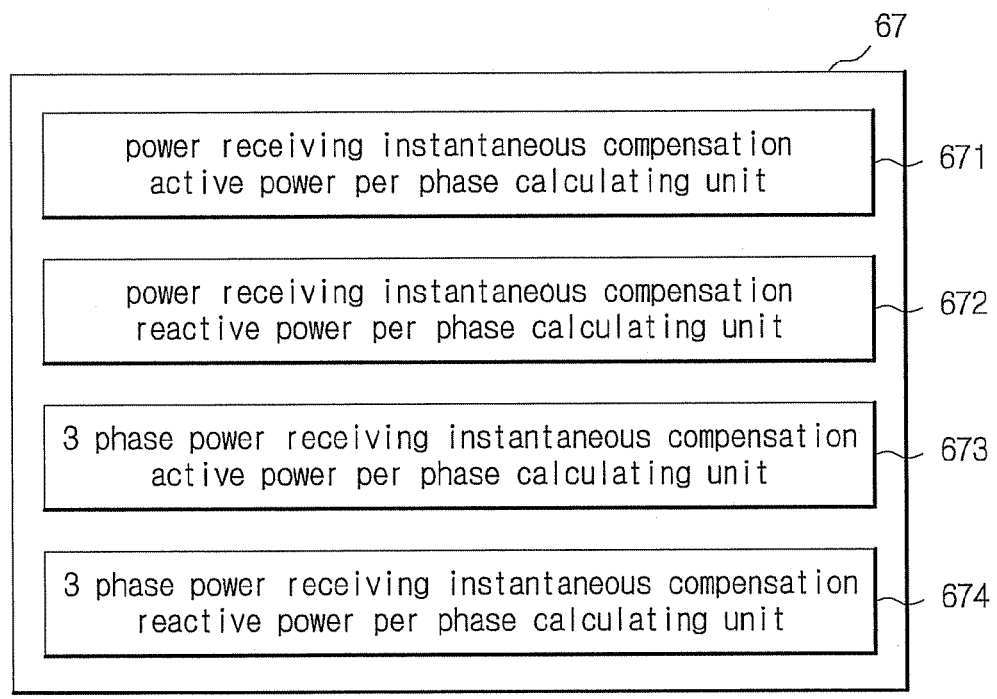
FIG. 17 to FIG. 21 are block views illustrating an example of a power receiving actual power usage calculating unit in FIG. 1.
Figure 18:
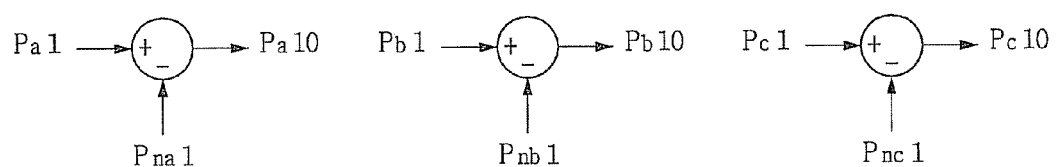
Figure 19:
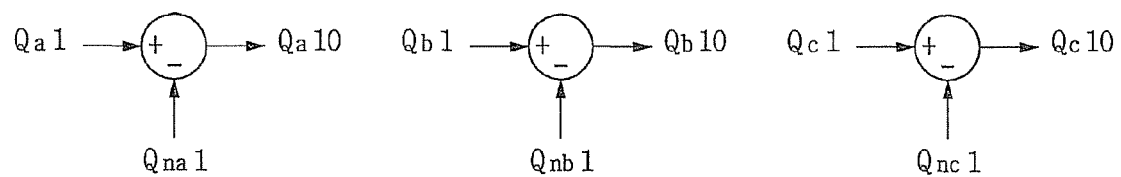
Figure 20:
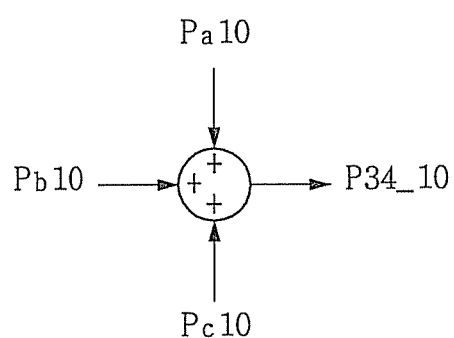
Figure 21:
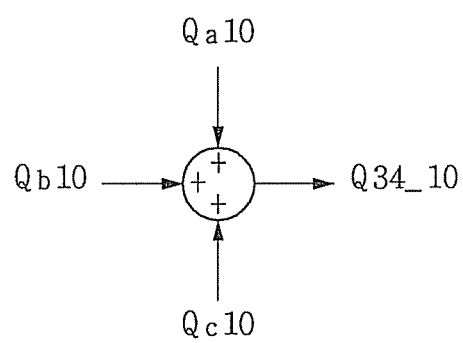

The reverse load flow determining unit 64 may include a current intensity comparing unit 641, a negative-sequence selecting unit 642, a voltage phase difference comparing unit 643, a first AND gate 644, and a second AND gate 645 as shown FIGS. 10 to 12.

The current intensity comparing unit 641 may compare the intensity of a negative-sequence is 2 and that of a zero-sequence is 0 when the reverse load flow is caused in a power system. Here, when the intensity of the negative-sequence is higher than that of the zero-sequence, the current intensity comparing unit 641 may determine as reverse load flow and output 1 at 1_rev, while it may output 0 for the rest of cases.

The negative-sequence selecting unit 642 may select negative-sequence based on a smaller value from a positive-sequence and a negative-sequence since when a rotation direction of 3 phase current changes, a positive-sequence and a negative-sequence are changed.

In addition, because a reverse load flow occurs in a 3 phase system, a method for determining 3 phase power supply is to output 1 at V_rev when phase difference of voltage per phase (Va_p and Vb_p, Vb_p and Vc_p, Vc_p and Va_p) exceeds 90° by using the voltage phase difference comparing unit 643 and the first AND gate 644 and output 0 for the rest of cases.

The second AND gate 645 outputs 0 or 1 by employing output of the current intensity comparing unit 641 and output of the first AND gate 644.

A reverse load flow phenomenon in a power supply system is caused by load variations in the system and when power caused by the reverse load flow is higher than actual power transmitted and received by the user, a measurement error occurs, while when power caused by the reverse load flow is smaller than actual power transmitted and received by the user, a measurement error does not occur.

The power receiving reverse load flow calculating unit 65 may calculate amount of power receiving reverse load flow power if the reverse load flow determining unit 64 determines as power receiving direction reverse load flow.

According to FIG. 13 to FIG. 16, the power receiving reverse load flow calculating unit 65 may include a power receiving reverse load flow phase angle per phase calculating unit 657, a power receiving active reverse load flow per phase calculating unit 651 and a power receiving reactive reverse load flow per phase calculating unit 654.

The power receiving reverse load flow phase angle per phase calculating unit 657 calculates phase difference Θna, Θnb, Θnc by adding 180° to each phase of voltage per phase and substrating phase In_p of neutral line current.

The calculated phase difference value is provided to the power receiving active reverse load flow per phase calculating unit 651 and the power receiving reactive reverse load flow per phase calculating unit 654.

The power receiving active reverse load flow per phase calculating unit 651 may calculate with functions of active power of reverse load flow per phase as shown in Equations 13 to 15:

$$Pna1 = Va\_m * In\_m * \cos \theta na/3 \qquad \text{Equation 13}$$

(wherein, Pna1 is active power of a phase during the reverse load flow, Va_m is voltage of a phase, In_m is neutral line current, θna is phase difference during the reverse load flow);

$$Pnb1 = Vb\_m * In\_m * \cos \theta nb/3 \qquad \text{Equation 14}$$

(wherein, Pnb1 is active power of b phase during the reverse load flow, Vb_m is voltage of b phase, In_m is neutral line current, θnb is active power of b phase during the reverse load flow); and $$Pnc1 = V\_cm * In\_m * \cos \theta nc/3 \qquad \text{Equation 15}$$

(wherein, Pnc1 is active power of c phase during the reverse load flow, Vc_m is voltage of c phase, In_m is neutral line current, θnc is phase difference of c phase during the reverse load flow).

The power receiving active reverse load flow per phase calculating unit 651 can calculate each of active powers Pna1, Pnb1, Pnc1 generated by reverse load flow in the power receiving direction. The power receiving active reverse load flow per phase calculating unit 651 can calculate the active power Pna1, Pnb1, Pnc1 by use of a current value, which is obtained by dividing the neutral line current into 3, and a phase difference, which the phase of a phase current subtracted by the phase of the neutral line current, since the intensity (In_m) of the neutral line current is three times greater than that of the phase current when the reverse load flow occurs.

The power receiving reactive reverse load flow per phase calculating unit 654 may calculate with functions of reactive power of reverse load flow per phase as shown in Equations 16 to 18:

$$Qna1 = Va\_m * In\_m * \sin \theta na/3 \qquad \text{Equation 16}$$

(wherein, Qna1 is reactive power of a phase during the reverse load flow, Va_m is voltage of a phase, In_m is neutral line current, θna is phase difference of a phase during the reverse load flow);

$$Qnb1 = Vb\_m * In\_m * \sin \theta nb/3 \qquad \text{Equation 17}$$

(wherein, Qnb1 is reactive power of b phase during the reverse load flow, Vb_m is voltage of b phase, In_m is neutral line current, θnb is phase difference of b phase during the reverse load flow); and $$Qnc1 = Vc\_m * In\_m * \sin \theta nc/3 \qquad \text{Equation 18}$$

(wherein, Pnc1 is reactive power of c phase during the reverse load flow, Vc_m is voltage of c phase, In_m is neutral line current, θnc is phase difference of c phase during the reverse load flow)

The power receiving reactive reverse load flow per phase calculating unit 654 can calculate each of reactive powers Qna1, Qnb1, Qnc1 generated by reverse load flow in the power receiving direction. The power receiving active reverse load flow per phase calculating unit 654 can calculate the reactive power Qna1, Qnb1, Qnc1 by use of a current value, which is obtained by dividing the neutral line current into 3, and a phase difference, which the phase of a phase current subtracted by the phase of the neutral line current, since the intensity (In_m) of the neutral line current is three times greater than that of the phase current when the reverse load flow occurs.

The reverse load flow determining unit 64 may determine whether a reverse load flow occurs or not by comparing the intensity of load current per phase when a reverse load flow occurs with that of the neutral line current in a system. Because multiple functions 653, 656 multiple 1 to a rev value when a reverse load flow occurs, while they do 0 when a reverse load flow does not occur to determine whether to compensate active, reactive power caused by the reverse load flow, the reverse load flow determining unit 64 is thus able to determine whether to compensate active power and reactive power according to the occurence of the reverse load flow.

The power receiving actual power usage calculating unit 67 may calculate actual power usage by employing the instantaneous power value inputted from the power receiving instantaneous power calculating unit 62 and the reverse load flow power value inputted from the power receiving reverse load flow calculating unit 65.

For this purpose, the power receiving actual power usage calculating unit 67 may include a power receiving instantaneous compensation active power per phase calculating unit 671, a power receiving instantaneous compensation reactive power per phase calculating unit 672, a 3 phase power receiving instantaneous compensation active power per phase calculating unit 673 and a 3 phase power receiving instantaneous compensation reactive power per phase calculating unit 674 As shown FIG. 17 to FIG. 21, the power receiving instantaneous compensation active power per phase calculating unit 671 may calculate each out value Pa10, Pb10, Pc10 of compensated instantaneous active power per phase traded between a provider and a user by subtracting reverse load flow instantaneous active power per phase, Pna1, Pnb1, Pnc1 from the power receiving instantaneous active power per phase, Pa1, Pb1, Pc1.

The power receiving instantaneous compensation reactive power per phase calculating unit 672 may calculate each out value Qa10, Qb10, Qc10 of compensated instantaneous reactive power per phase traded between a provider and a user by subtracting the reverse load flow instantaneous reactive power per phase, Qna1, Qnb1, Qnc1 from the power receiving instantaneous reactive power per phase Qa1, Qb1, Qc1.

The 3 phase power receiving instantaneous compensation active power calculating unit 673 may calculate 3 phase power receiving instantaneous compensation active power P34_10 by conducting vector sum with a 3 terminal addition function for instantaneous power per phase Pa10, Pb10, Pc10 compensated at the same point per phase to determine 3 phase active power. Further, the 3 phase power receiving instantaneous compensation reactive power calculating unit 674 may calculate 3 phase power receiving instantaneous compensation reactive power Q34_10 by conducting vector sum with a 3 terminal addition function for reactive power per phase Qa10, Qb10, Qc10 compensated at the same point per phase to determine 3 phase reactive power.

The power receiving direction determining unit 69 may determine power transmitting direction un-metered usage, active power and reactive power from the calculated actual power usage value to store actual power usage value.

Figure 22:
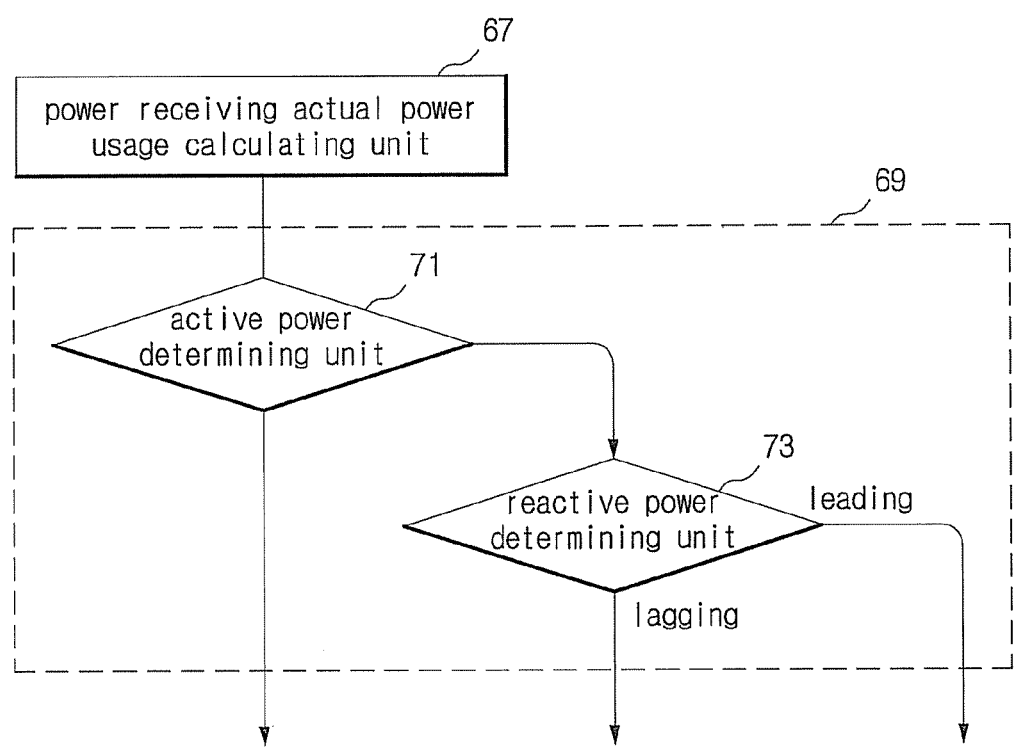
FIG. 22 to FIG. 25 are block views illustrating an example of a power receiving direction determining unit in FIG. 1.

As shown in FIG. 22, the power receiving direction determining unit 69 may include a power receiving active power determining unit 71 and a power receiving reactive power determining unit 73.

Figure 23:
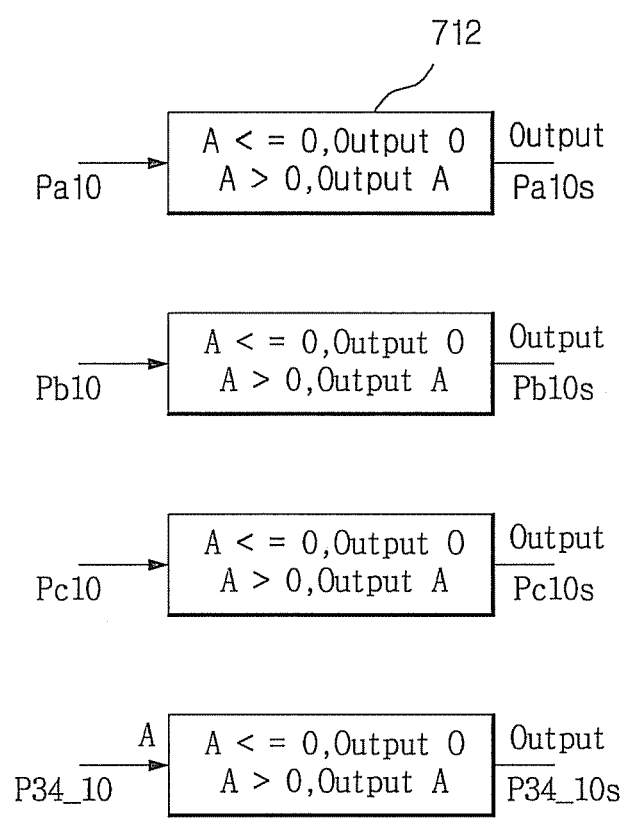

As shown in FIG. 23, the power receiving active power determining unit 71 may output 0 if the active power value Pa10, Pb10, Pc10, P34_10 compensated at the intensity selecting unit 712 is equal to or smaller than 0, and output active power value Pa10s, Pb10s, Pc10s, P34_10s if it is higher than 0.

Figure 24:
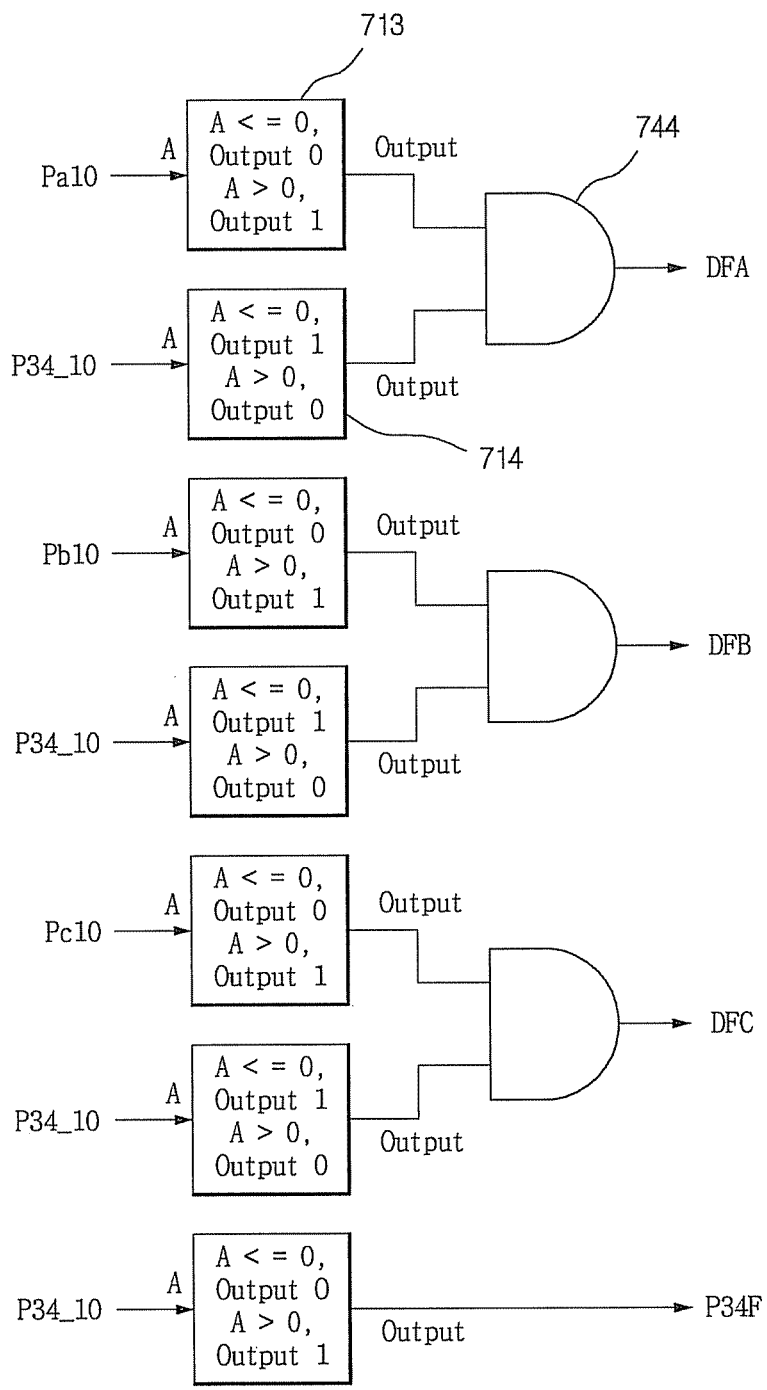

As shown in FIG. 24, the power receiving active power determining unit 71 may input at a AND gate 744 after comparing the intensity of compensated active power Pa10 of a phase at an intensity selecting unit 713 and input at a AND gate 744 after comparing the intensity of compensated 3 phase active power P34_10 at an intensity selecting unit 713. The AND gate 744 outputs DFA if both inputted values are 1.

For example, the intensity selecting unit 713 outputs 0 if the intensity of compensated active power Pa10 of a phase is equal to or smaller than 0 and outputs 1 if it is higher than 0 and then inputs the result to the AND gate 744. Here, if both the intensity of compensated active power Pa10 of a phase and the intensity of compensated 3 phase active power P34_10 are higher than 0, it is able to output DFA.

DFB and DFC may be outputted by calculating for the other b and c phase as described above. 0 is outputted if the compensated 3 phase active power P34_10 is equal to or smaller than 0 and 1 is outputted if it is higher than 0.

That is, reverse direction per phase of the power receiving direction is detected when the sum of 3 phase active power of the power receiving direction is smaller than 0 and the active power per phase of the power receiving direction is higher than 0 to output out value DFA, DFB, DFC.

Figure 25:
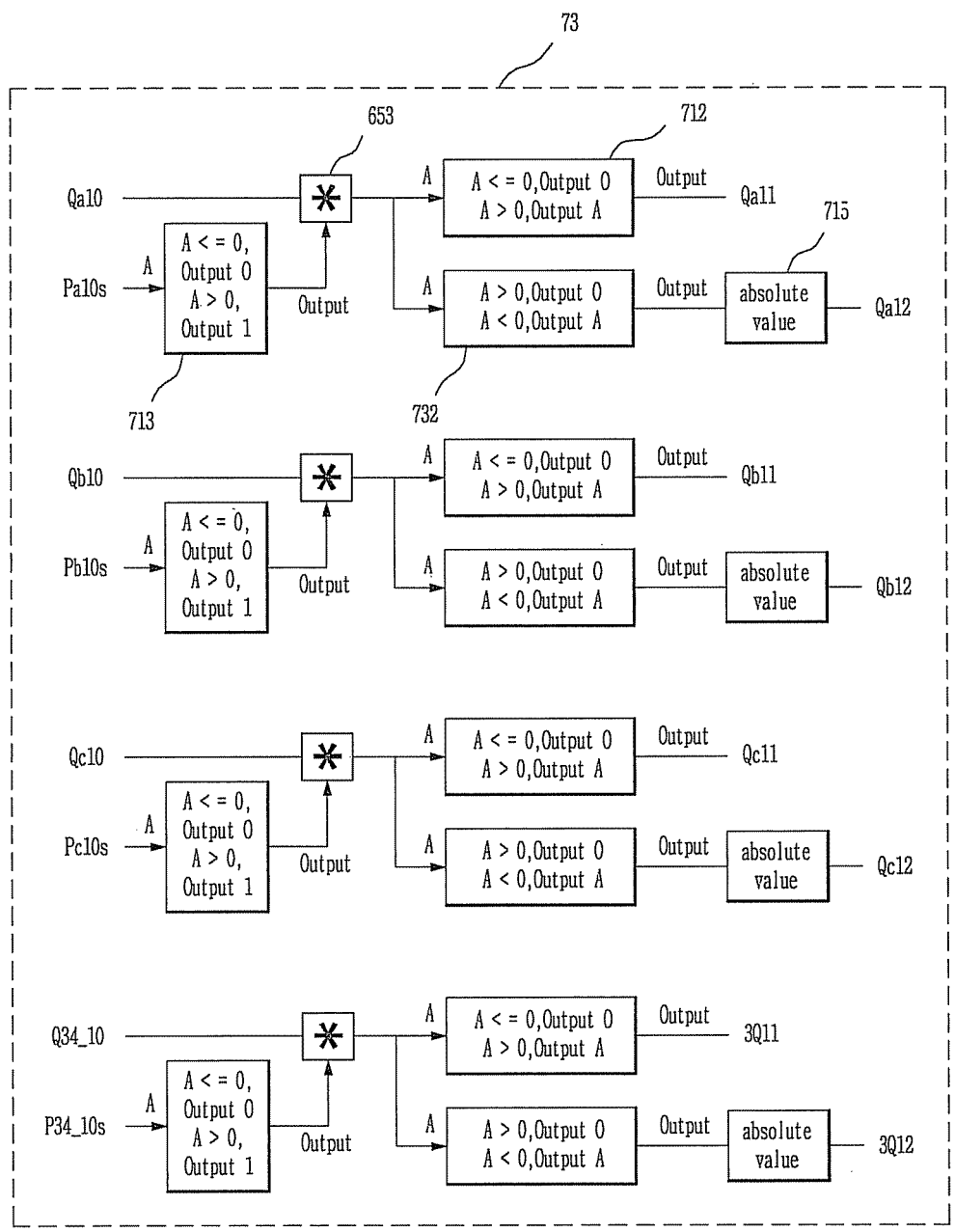

As shown in FIG. 25, the power receiving reactive power determining unit 73 may determine reactive power value Qa10, Qb10, Qc10, Q34_10 if the intensity selecting unit 713 determines active power of the power receiving direction when the compensated active power per phase Pa10s, Pb10s, Pc10s, P34_10s is higher than 0, and output 0 for a reactive power value at the multiple function 653 if active power Pa10s, Pb10s, Pc10s, P34_10s is smaller than 0.

The power receiving reactive power determining unit 73 may divide the outputted reactive power to lagging reactive power and leading reactive power. As shown in FIG. 25, the intensity selecting unit 712 outputs lagging reactive power Qa11, Qb11, Qc11, 3Q11 if the compensated reactive power per phase and the compensated reactive power of 3 phase of the power receiving direction Qa10, Qb10, Qc10, Q34_10 are higher than 0, and outputs leading reactive power Qa12, Qb12, Qc12, 3Q12 if they are smaller than 0.

A conventional power meter determines a metered value per phase with power transmitting, receiving direction or 0 if active power per phase deviates from 0-±90°. However, power receiving direction and power transmitting direction is determined based on the sum of 3 phase powers in order to prevent such a problem in the present invention. In addition, if 3 phase active power is the power receiving direction and active power per phase exceeds a metering range, '−' active power is measured and lagging reactive power which exceeds a metering range is calculated with leading reactive power. In contrast, leading reactive power is calculated with lagging reactive power.

The power transmitting direction and the power receiving direction are determined by the intensity of 3 phase active power, and lagging reactive power and leading reactive power are determined by the intensity of 3 phase lagging reactive power and 3 phase leading reactive power based on the determined 3 phase active power.

The sum of 3 phase active power of the power receiving direction is equal to the sum of active power per phase of the power receiving direction, the sum of 3 phase lagging reactive power of the power receiving direction is equal to the sum of lagging reactive power per phase of the power receiving direction, and the sum of 3 phase leading reactive power of the power receiving direction is equal to the sum of leading reactive power per phase of the power receiving direction.

For example, if a phase among a, b, c phases is reverse direction load flow exceeding a metering range, b and c phase are normally determined and the power receiving direction P34F and the power transmitting direction P34R are first determined based on the intensity of 3 phase active power and active power per phase is calculated by the direction P34F of 3 phase active power.

Figure 26:
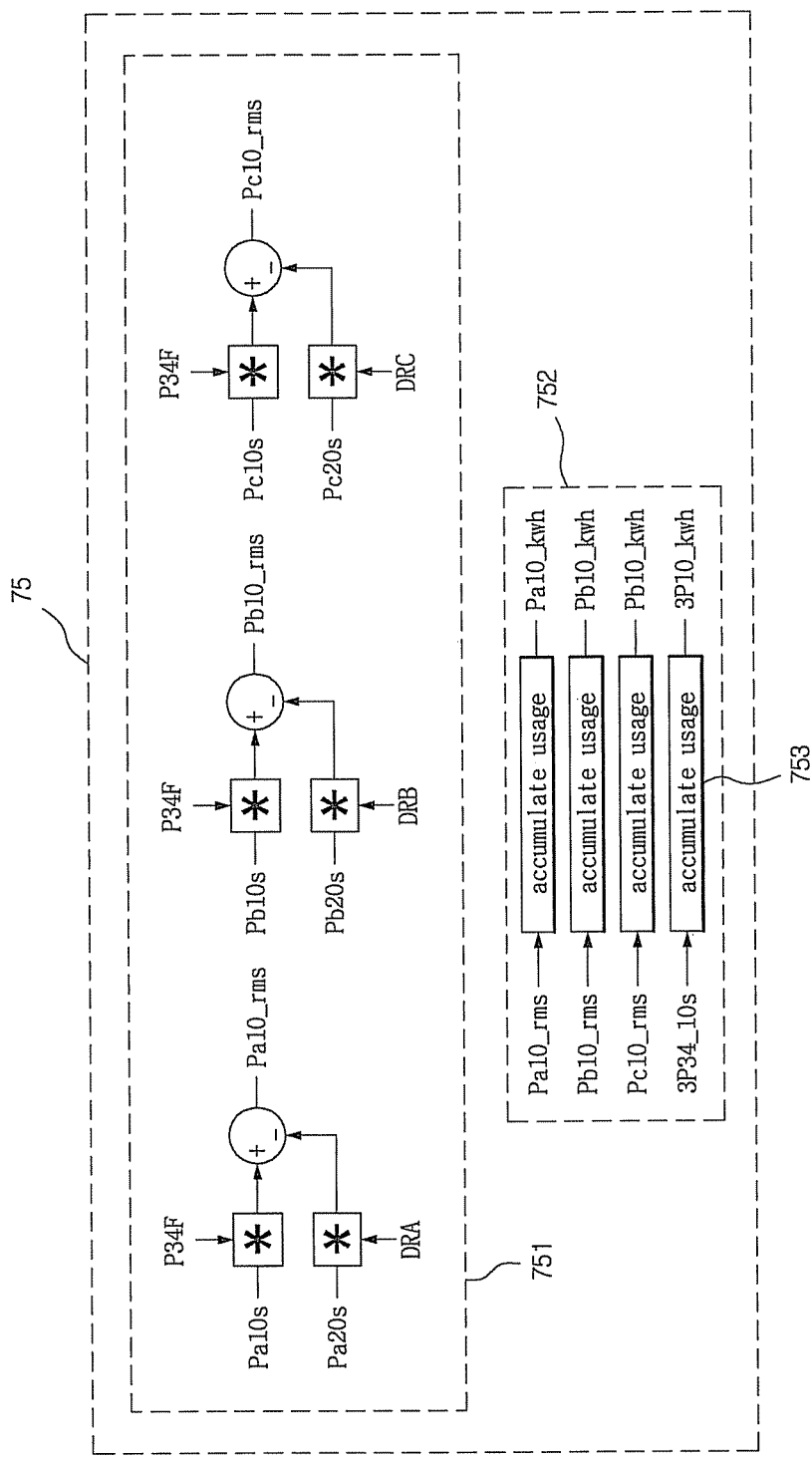
FIG. 26 is a block view illustrating an example of a power receiving active power storing unit in FIG. 1.

The power receiving direction active power storing unit 75 may include a power receiving direction active power per phase metering unit 751, a power receiving direction 3 phase active power integrating unit 752, a power receiving direction active power storing unit, and a power receiving direction 3 phase active power storing unit as shown in FIG. 1 and FIG. 26.

The power receiving direction active power per phase metering unit 751 determines 0 for a phase active power Pa10s of the power receiving direction when reverse direction load flow occurs in a phase and determines a phase active power of the power transmitting direction Pa20s as shown in FIG. 26. Here, if 3 phase active power of the power transmitting direction P34_20 is smaller than 0 and a phase active power of the power transmitting direction Pa20 is higher than 0, DRA outputs 1 and a phase active power is determined as "-" by a 2 terminal subtraction unit 671, and out value of DRB and DRC of b and c phase is 0 and reverse direction power is not determined. The power receiving direction active power usage integrating unit 752 integrates active power value calculated per phase and 3 phase active power usage accumulated value 753 by time.

The power receiving active power per phase storing unit and the 3 phase power receiving active power storing unit may store amount of active power per phase and amount of 3 phase active power, respectively.

Figure 27:
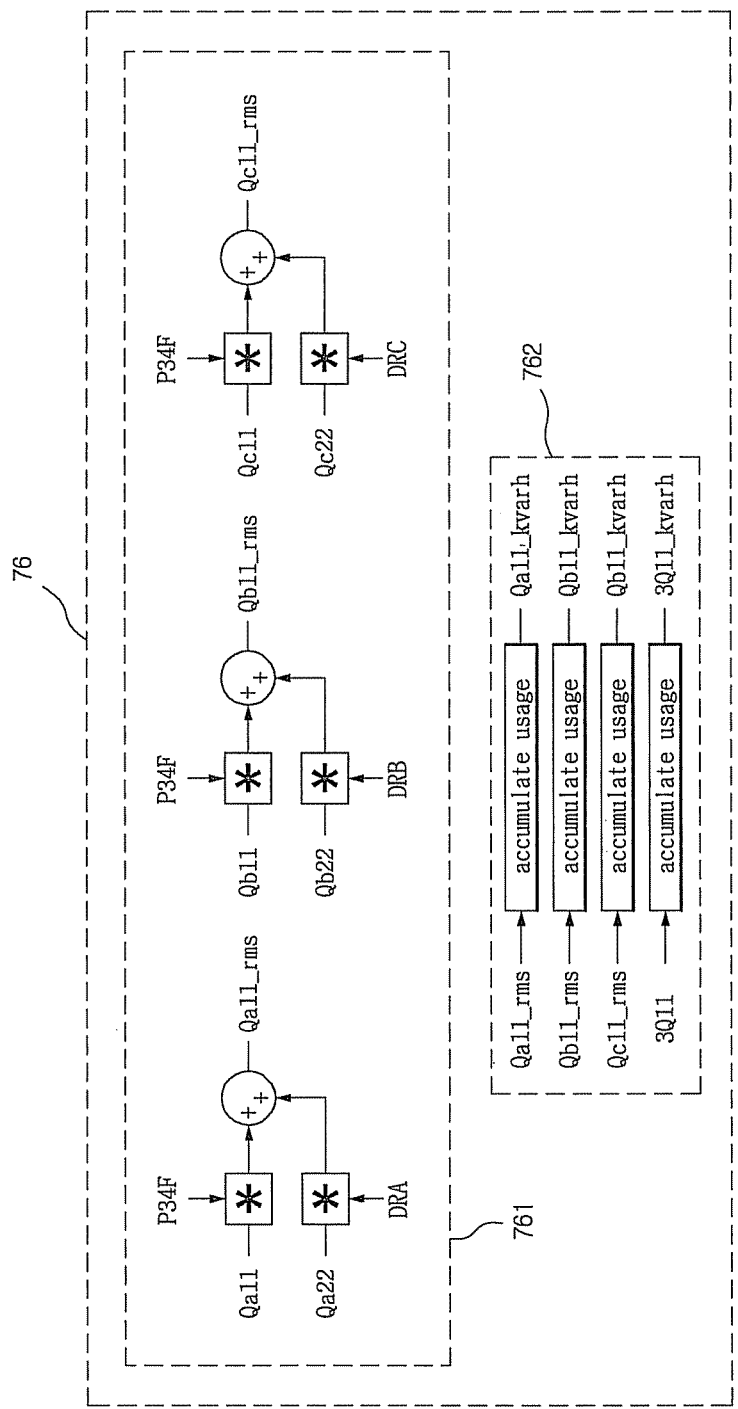
FIG. 27 a block view illustrating an example of a power receiving lagging reactive power storing unit in FIG. 1.
Figure 28:
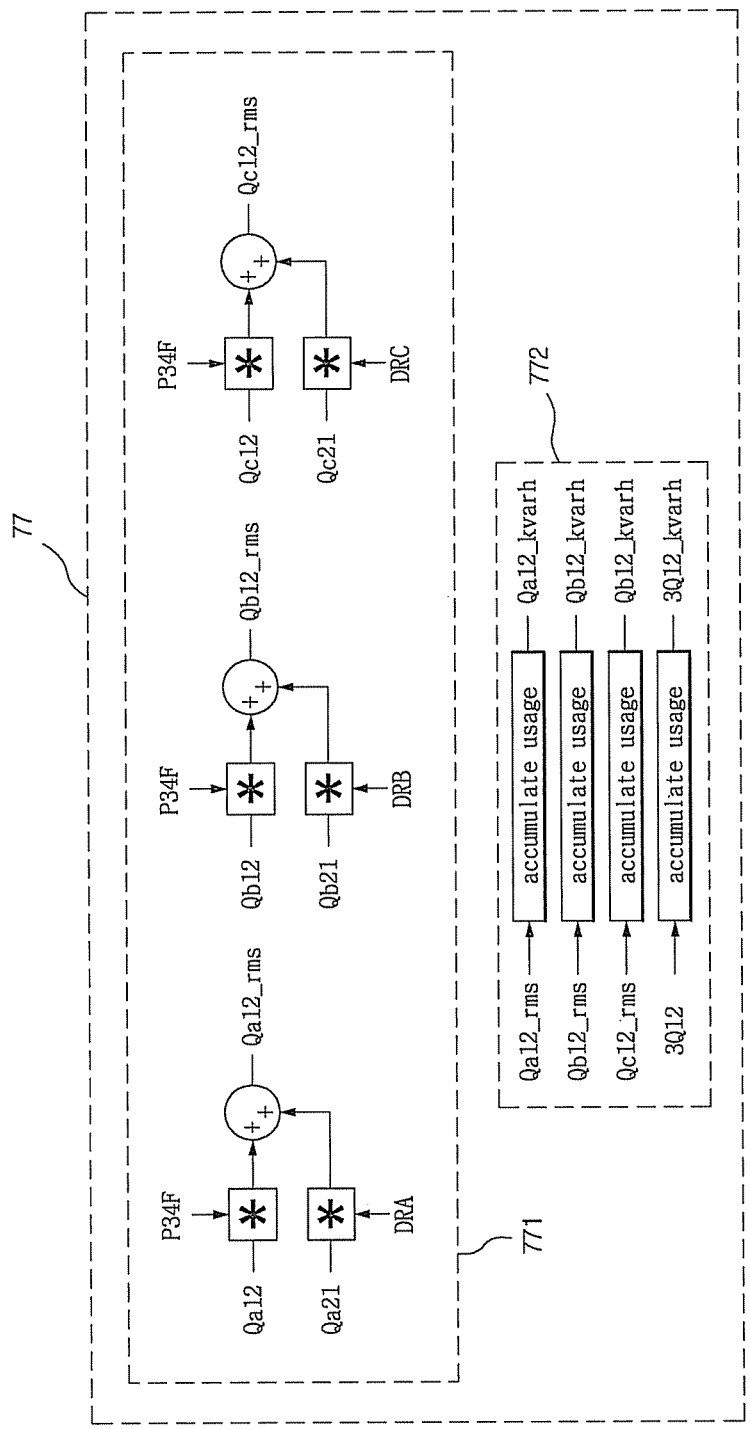
FIG. 28 a block view illustrating an example of a power receiving leading reactive power storing unit in FIG. 1.

As shown in FIG. 27, the power receiving direction lagging reactive power storing unit 76 may include a power receiving lagging reactive power per phase metering unit 761, a 3 phase power receiving lagging reactive power integrating unit 762, a power receiving lagging reactive power per phase storing unit, and a 3 phase power receiving lagging reactive power storing unit.

The power receiving lagging reactive power per phase metering unit 761 determines 0 for a phase lagging reactive power Qa11 of the power receiving direction based on a phase and a phase leading reactive power Qa22 of the power transmitting direction when reverse direction load flow occurs in a phase. Here, 1 is outputted as a condition value (DRA) to determine a phase reactive power toward the power receiving direction and lagging reactive power of the power receiving direction Qa11 and leading reactive power of the power transmitting direction Qa22 are determined with a phase lagging reactive power by employing 2 terminal addition function, and out value of DRB and DRC of b and c phase is 0 and leading reactive power is not determined. Here, the 3 phase lagging reactive power of the power receiving direction is equal to the sum of lagging reactive power per phase.

The lagging reactive power usage integrating unit of the power receiving direction 762 integrates the lagging reactive power value calculated per phase and 3 phase lagging reactive power usage accumulated value by time.

The leading reactive power storing unit of the power receiving direction 77 may include a power receiving leading reactive power per phase metering unit 771, a 3 phase power receiving lagging reactive power integrating unit 772, a power receiving lagging reactive power per phase storing unit and a 3 phase power receiving lagging reactive power storing unit.

The power receiving leading reactive power per phase metering unit 771 determines the leading reactive power as 0 when reverse direction load flow occurs in a phase because a phase leading reactive power of the power receiving direction Qa12 does not determine a phase active power based on a phase. Here, 1 is outputted as a condition value (DRA) to determine a phase reactive power toward the power receiving direction and a phase lagging reactive power of the power receiving direction Qa21 is determined as 0. The a phase leading reactive power of the power receiving direction Qa12 and the a phase lagging reactive power of the power receiving direction Qa21 are outputted as a phase leading reactive power by employing 2 terminal addition function, and out value of DRB and DRC of b and c phase is 0 and lagging reactive power is not determined. Here, the 3 phase leading reactive power of the power receiving direction is equal to the sum of leading reactive power per phase.

The leading reactive power usage integrating unit of the power receiving direction 772 integrates leading reactive power value calculated per phase and 3 phase leading reactive power value by time.

The compensated power receiving active power Pa10_rms, Pb10_rms, Pc10_rms, 3P10_rms, the lagging reactive power Qa11_rms, Qb11_rms, Qc11_rms, 3Q11_rms, the leading reactive power Qa12_rms, Qb12_rms, Qc12_rms, 3Q12_rms are stored and outputted and the amount of active power Pa10_kwh, Pb10_kwh, Pc10_kwh, 3P10_kwh, the lagging reactive power usage Qa11_kvarh, Qb11_kvarh, Qc11_kvarh, 3Q11_kvarh, the leading reactive power usage Qa12_kvarh, Qb12_kvarh, Qc12_kvarh, 3Q12_kvarh are accumulated and stored according to a metering function by time.

Figure 29:
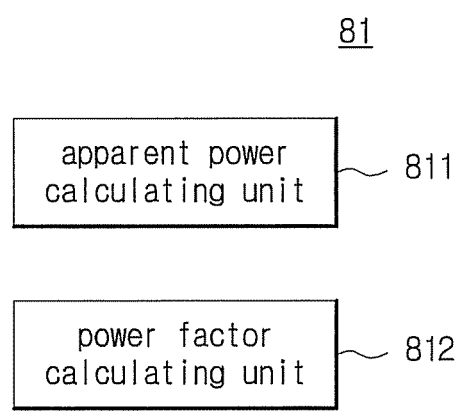
FIG. 29 to FIG. 31 are block views illustrating an example of a power receiving direction apparent power/power factor calculating unit.

A power receiving apparent power/power factor calculating unit 81 calculates apparent power and power factor and outputs the calculated values. As shown in FIG. 29, the power receiving apparent power/power factor calculating unit 81 may include an apparent power calculating unit 811 and a power factor calculating unit 812.

Figure 30:
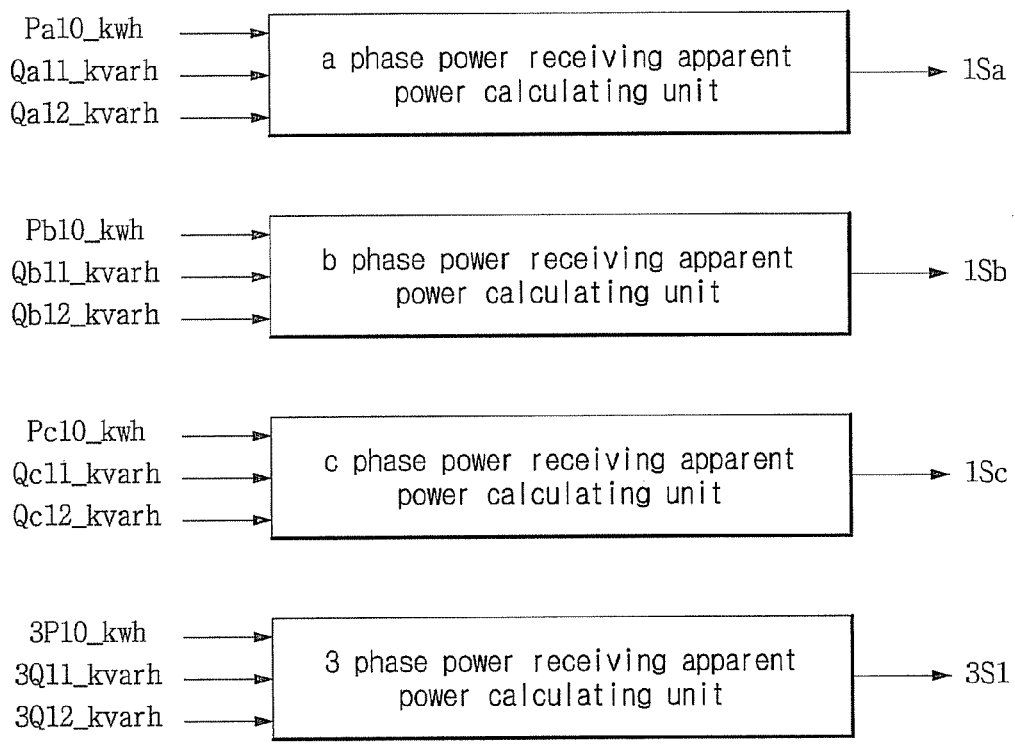

For example, as shown in FIG. 30, the power receiving apparent power calculating unit 811 may calculate apparent power per phase and 3 phase power receiving apparent power. Here, the power receiving apparent power calculating unit 811 may calculate each apparent power per phase and amount of apparent power 1Sa, 1Sb, 1Sc, 3S1 by employing functions for calculating apparent power of Equation 19 to Equation 22 by using power receiving RSM value-treated active power, lagging reactive power, leading reactive power and accumulated usage.

$$1Sa = \sqrt{Pa10_{kwh}^2 + (Qa11_{kvarh} + Qa12_{kvarh})^2} \quad \text{Equation 19}$$

(wherein, Pa10 is active power of a phase, Qa11 is lagging active power of a phase, Qa12 is leading reactive power of a phase)

$$1Sb = \sqrt{Pb10_{kwh}^2 + (Qb11_{kvarh} + Qb12_{kvarh})^2} \quad \text{Equation 20}$$

(wherein, Pa10 is active power of b phase, Qa11 is lagging reactive power of b phase, Qa12 is leading reactive power of b phase)

$$1Sc = \sqrt{Pc10_{kwh}^2 + (Qc11_{kvarh} + Qc12_{kvarh})^2} \quad \text{Equation 21}$$

(wherein, Pc10 is active power of c phase, Qc11 is lagging reactive power of c phase, Qc12 is leading reactive power of c phase)

$$3S1 = \sqrt{3P10_{kwh}^2 + (3Q11_{kvarh} + 3Q12_{kvarh})^2} \quad \text{Equation 22}$$

Figure 31:
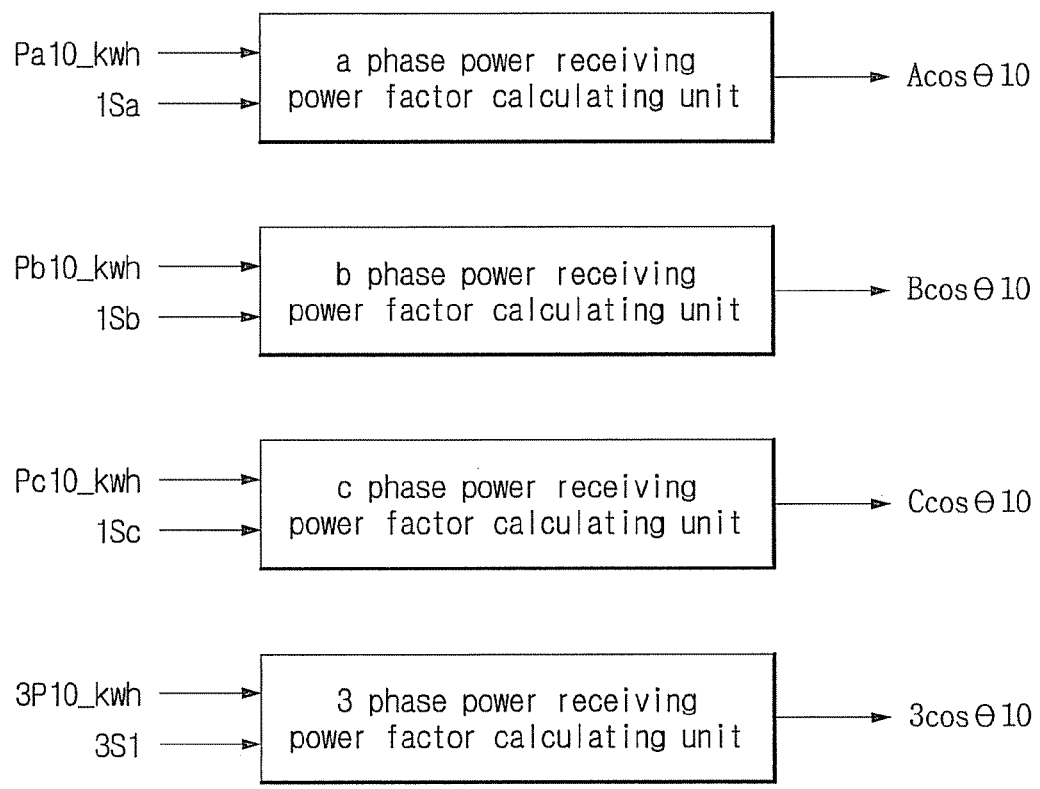

As shown in FIG. 31, the power receiving power factor calculating unit 812 may calculate power receiving power factor per phase and 3 phase power receiving power factor by employing power factor calculating functions with using power receiving active power and usage Pa10_kwh, Pb10_kwh, Pc10_kwh, 3P10_kwh and apparent power and apparent power usage 1Sa, 1Sb, 1Sc, 3S1.

Equation 23 to Equation 26 are equations for power receiving power factors and 3 phase power receiving power factors of a, b, and c phase.

$$A\cos\theta10 = Pa10\_kwh/1Sa \quad \text{Equation 23}$$

$$B\cos\theta10 = Pb10\_kwh/1Sb \quad \text{Equation 24}$$

$$C\cos\theta10 = Pc10\_kwh/1Sc \quad \text{Equation 25}$$

$$3\cos\theta10 = 3P10\_kwh/3S1 \quad \text{Equation 26}$$

Figure 32:
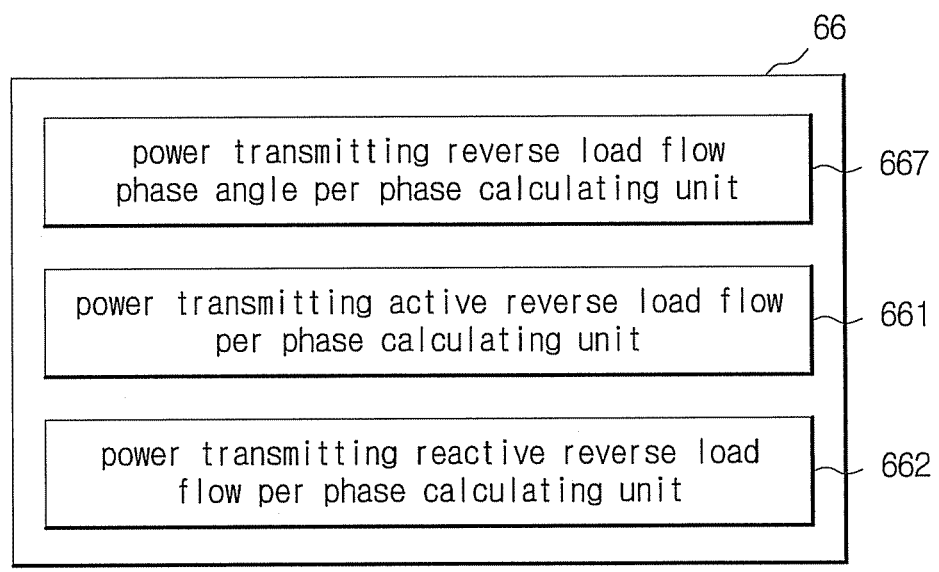
FIG. 32 to FIG. 35 are block views illustrating an example of a power transmitting reverse load flow calculating unit in FIG. 1.

A power transmitting reverse load flow calculating unit 66 in FIG. 1 and FIG. 32 may include a reverse load flow phase angle per phase calculating unit 667, a active reverse load flow per phase calculating unit 661 and a reactive reverse load flow per phase calculating unit 662 which have identical functions described in the power receiving reverse load flow calculating unit 65.

Figure 33:
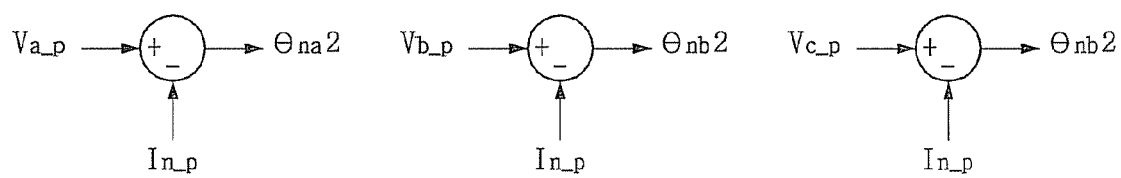

As shown in FIG. 33, the reverse load flow phase angle per phase calculating unit 667 may calculate phase angle per phase θna2, θnb2, θnc2 by subtracting phase of neutral line current (In_p) from phase of input voltage per phase Va_p, Vb_p, Vc_p.

Figure 34:
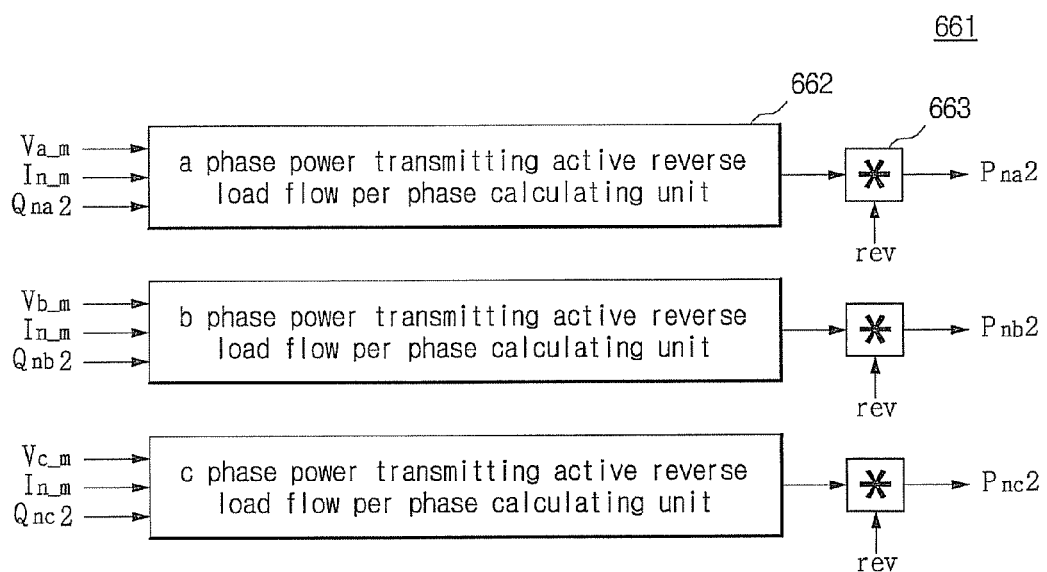

As shown in FIG. 34, the active reverse load flow per phase calculating unit 661 may calculate each active power of the power transmitting/receiving direction Pna2, Pnb2, Pnc2 caused by the reverse load flow by using voltage and phase difference per phase and a ⅓ current value of neutral line current since the neutral line current (In m) becomes 3 times higher than zero-sequence (is 0). The reverse load flow active power of the power transmitting direction may be obtained by the active power calculating functions of Equation 27 to Equation 29:

$$Pna2 = Va\_m * In\_m * \cos\theta na \cdot 2/3 \quad \text{Equation 27}$$

(wherein, Pna2 is active power of a phase during the reverse load flow, Va_m is voltage of a phase, In_m is neutral line current, θna2 is phase difference during the reverse load flow)

$$Pnb2 = Vb\_m * In\_m * \cos\theta nb \cdot 2/3 \quad \text{Equation 28}$$

(wherein, Pnb2 is active power of b phase during the reverse load flow, Vb_m is voltage of b phase, In_m is neutral line current, θnb2 is active power of b phase during the reverse load flow)

$$Pnc2 = Vc\_m * In\_m * \cos\theta nc \cdot 2/3 \quad \text{Equation 29}$$

(wherein, Pnc2 is active power of c phase during the reverse load flow, Vc_m is voltage of c phase, In_m is neutral line current, θnc2 is phase difference of c phase during the reverse load flow)

Figure 35:
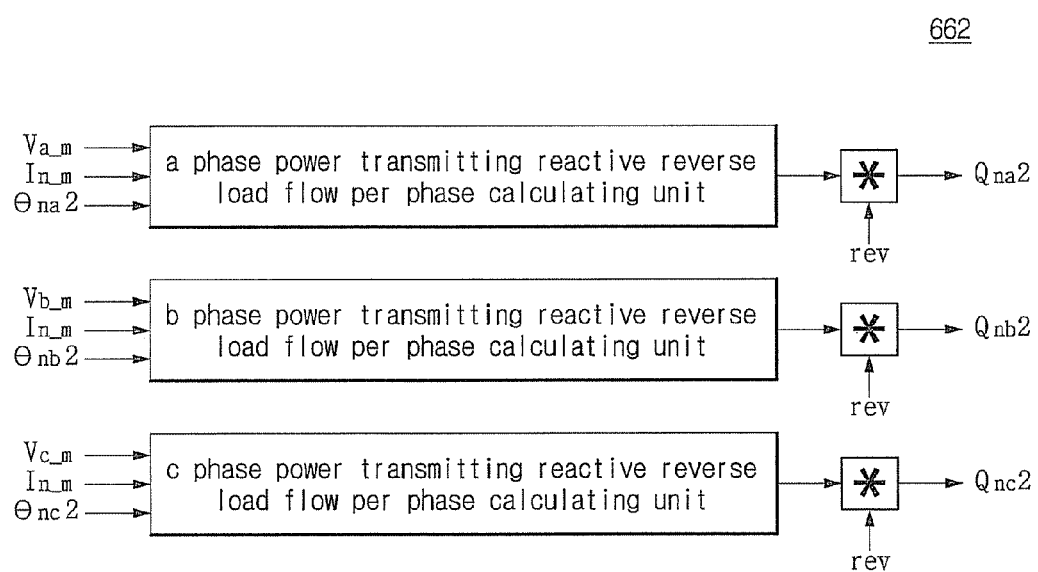
Figure 36:
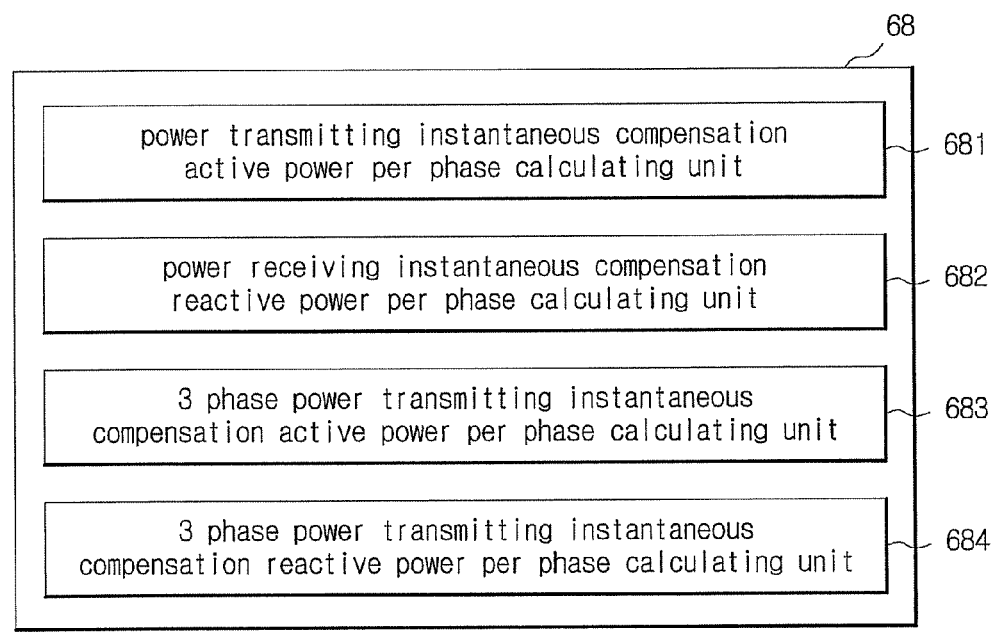
FIG. 36 to FIG. 40 are block views illustrating an example of a power transmitting actual power usage calculating unit in FIG. 1.
Figure 37:
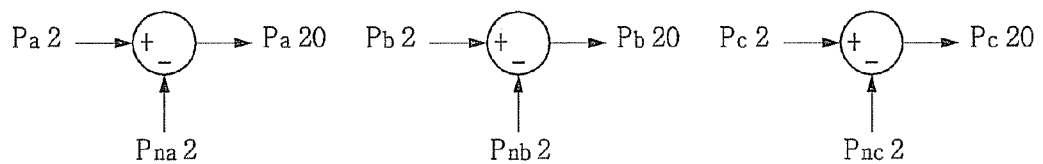
Figure 38:
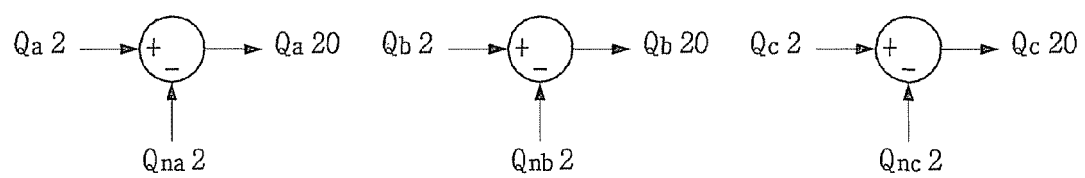
Figure 39:
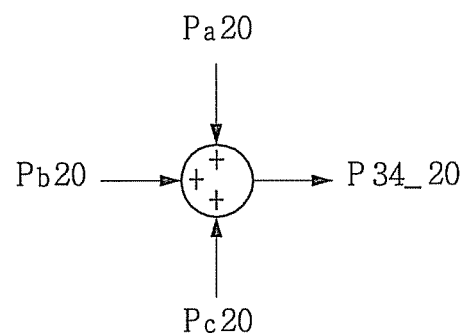
Figure 40:
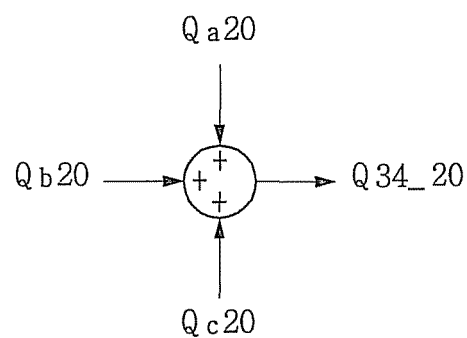

Reactive power of the reverse load flow is calculated at the reactive reverse load flow power per phase calculating unit 662 as in FIG. 35 which calculates reactive power of the reverse load flow of the power transmitting direction Qna2, Qnb2, Qnc2 by using voltage per phase and phase difference of the neutral line current by the same calculation method which the active power calculating unit of the reverse load flow 661 calculates.

Here, the reactive reverse load flow calculating unit 662 may calculate reactive reverse load flow per phase by using Equation 30 to Equation 32:

$$Qna2 = Va\_m * In\_m * \sin\theta na \cdot 2/3 \quad \text{Equation 30}$$

(wherein, Qna2 is reactive power of a phase during the reverse load flow, Va_m is voltage of a phase, In_m is neutral line current, θna2 is phase difference during the reverse load flow)

$$Qnb2 = Vb\_m * In\_m * \sin\theta nb \cdot 2/3 \quad \text{Equation 31}$$

(wherein, Qnb2 is reactive power of b phase during the reverse load flow, Vb_m is voltage of b phase, In_m is neutral line current, θnb2 is phase difference of b phase during the reverse load flow)

$$Qnc2 = Vc\_m * In\_m * \sin\theta nc \cdot 2/3 \quad \text{Equation 32}$$

(wherein, Qnc2 is reactive power of c phase during the reverse load flow, Vc_m is voltage of c phase, In_m is neutral line current, θnc2 is phase difference of c phase during the reverse load flow)

Here, the reverse load flow determining unit 64 may determine whether a reverse load flow occurs or not by comparing the intensity of load current per phase when a reverse load flow occurs with that of the neutral line current in a system. Because multiple functions 653, 656 multiple 1 to a rev value when a reverse load flow occurs, while they do 0 when a reverse load flow does not occur to determine whether to compensate active, reactive power caused by the a reverse load flow, the reverse load flow determining unit 64 is thus able to determine whether to compensate active power and reactive power according to the occurrence of the reverse load flow.

The power transmitting direction reverse load flow calculating unit 68 can determine whether or not the active power and the reactive power generated by the reverse load flow are to be compensated. Here, in order to determine the compensation of the active power and the reactive power, the power transmitting direction reverse load flow calculating unit 68 multiplies 1 to the reverse value when there is reverse load flow and multiplies 0 to the reverse value when there is no reverse load flow.

A power transmitting actual power usage calculating unit 68 may calculate actual power usage by employing the instantaneous power value inputted from the power transmitting instantaneous power calculating unit 63 and the reverse load flow power value inputted from the power transmitting reverse load flow calculating unit 66.

For this purpose, the power transmitting actual power usage calculating unit 68 may include a power transmitting instantaneous compensation active power per phase calculating unit 681, a power receiving instantaneous compensation reactive power per phase calculating unit 682, a 3 phase power transmitting instantaneous compensation active power per phase calculating unit 683, and a 3 phase power transmitting instantaneous compensation reactive power per phase calculating unit 684.

As shown FIG. 36 to FIG. 40, the power transmitting instantaneous compensation active power per phase calculating unit 681 may calculate each out value Pa20, Pb20, Pc20 of compensated instantaneous active power per phase traded between a provider and a user by subtracting reverse load flow instantaneous active power per phase, Pna2, Pnb2, Pnc2 from power transmitting instantaneous active power per phase, Pa2, Pb2, Pc2.

The power transmitting instantaneous compensation reactive power per phase calculating unit 682 may calculate each out value Qa20, Qb20, Qc20 of compensated instantaneous reactive power per phase traded between a provider and a user by subtracting reverse load flow instantaneous reactive power per phase, Qna2, Qnb2, Qnc2 from power transmitting instantaneous reactive power per phase Qa2, Qb2, Qc2.

The 3 phase power receiving transmitting instantaneous compensation active power calculating unit 683 may calculate 3 phase power transmitting instantaneous compensation active power P34_20 by conducting vector sum of instantaneous power per phase Pa20, Pb20, Pc20 compensated at the same point per phase with a 3 terminal addition function to determine 3 phase active power.

Further, the 3 phase power transmitting instantaneous compensation reactive power calculating unit 684 may calculate 3 phase power transmitting instantaneous compensation reactive power Q34_20 by conducting vector sum of reactive power per phase Qa20, Qb20, Qc20 compensated at the same point per phase with a 3 terminal addition function to determine 3 phase reactive power of the power transmitting direction.

A power transmitting direction determining unit 70 may determine power receiving direction un-metered usage, active power and reactive power from the calculated actual power usage value to store actual power usage value.

Figure 41:
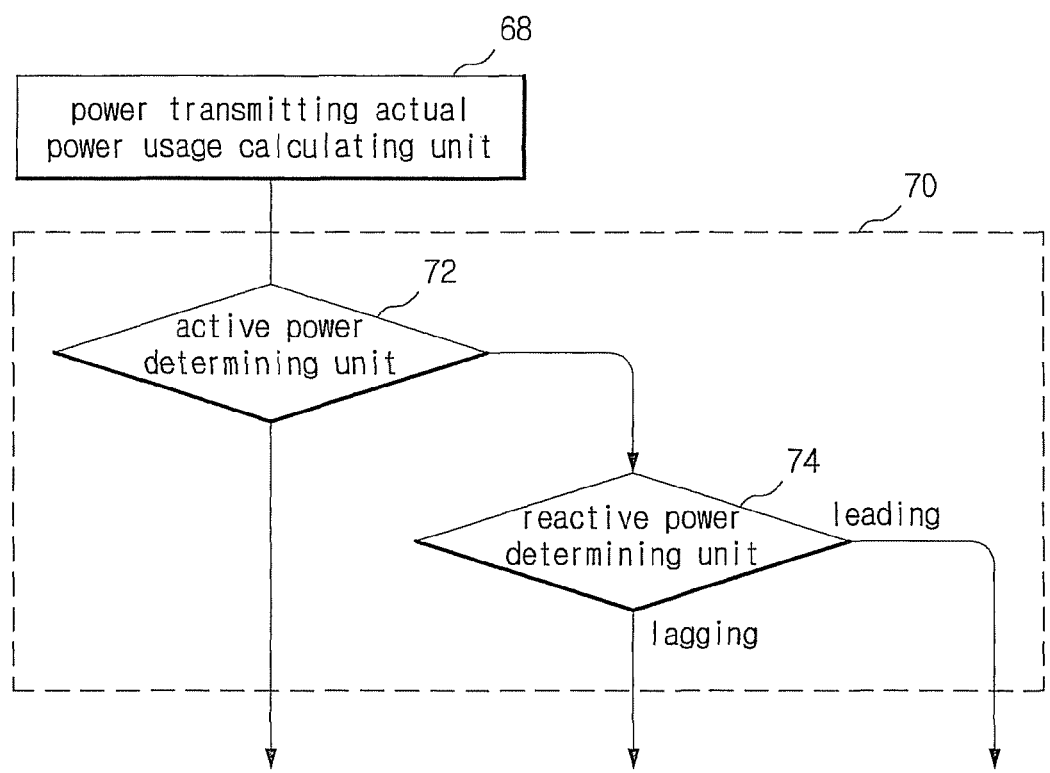
FIG. 41 to FIG. 44 are block views illustrating an example of a power transmitting direction determining unit in FIG. 1.

As shown in FIG. 41, the power transmitting direction determining unit 70 may include a power transmitting active power determining unit 72 and a power transmitting reactive power determining unit 74.

Figure 42:
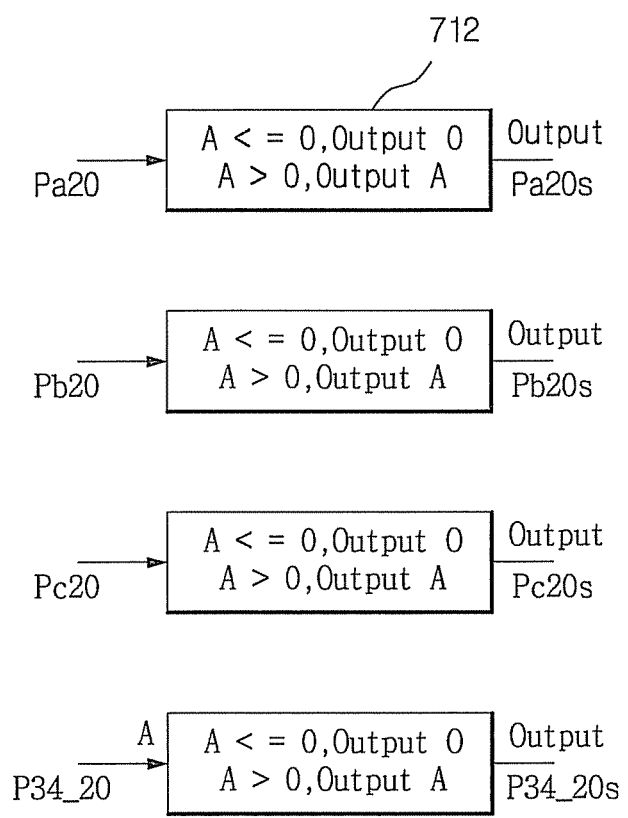

As shown in FIG. 42, the power transmitting active power determining unit 72 may determine 0 if the value Pa20, Pb20, Pc20, P34_20 of active power compensated from intensity selecting unit 712 is equal to or smaller than 0 and determine active power value if it is higher than 0.

Figure 43:
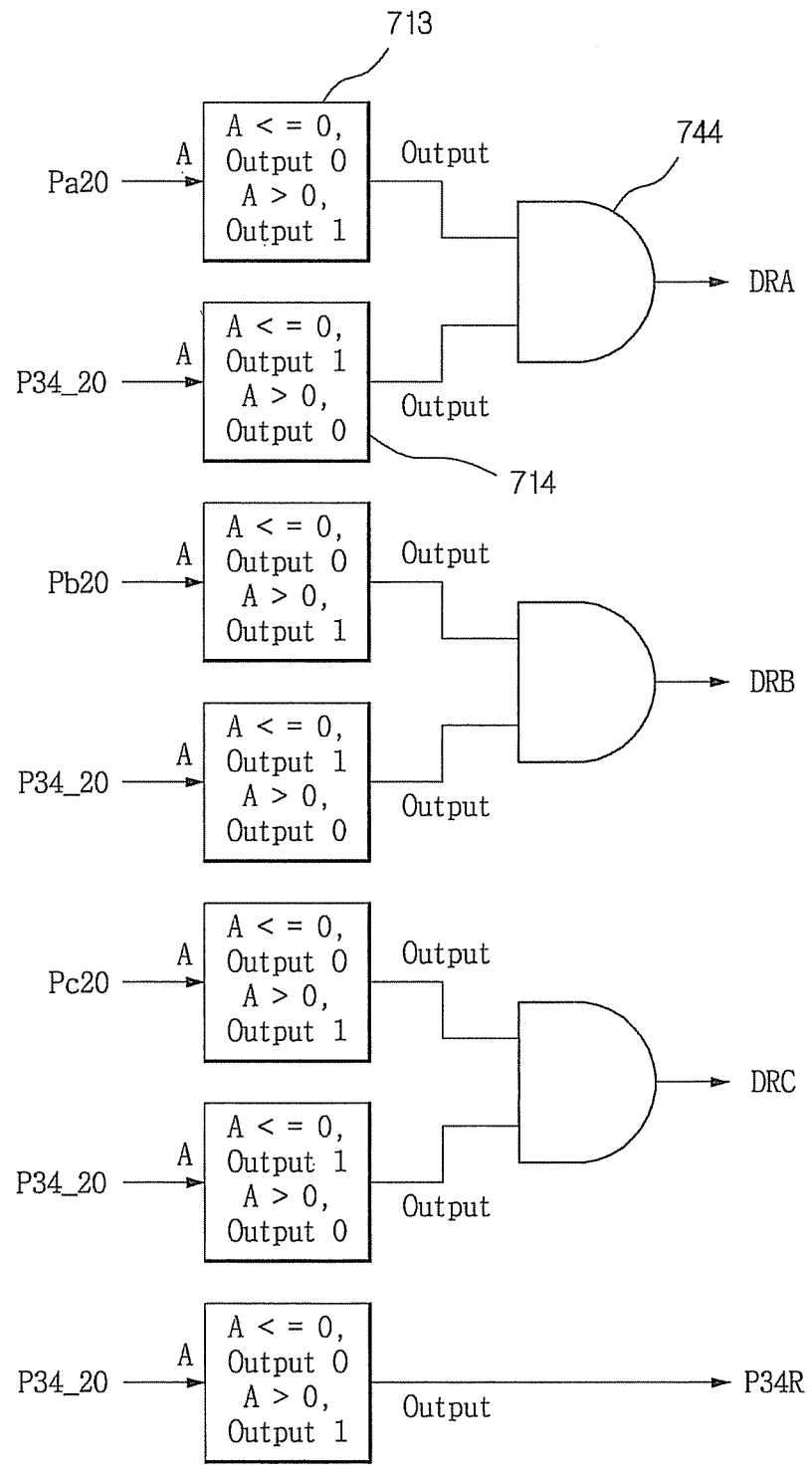

As shown in FIG. 42 and FIG. 43, the power transmitting reactive power determining unit 74 may determine active power of the power transmitting direction and determine reactive power value Qa20, Qb20, Qc20, Q34_20 if active power value Pa20, Pb20, Pc20, P34_20 compensated at the intensity selecting unit 712 is higher than 0, and output 0 for a reactive power value at the multiple function 653 if active power value Pa20, Pb20, Pc20, P3420 is smaller than 0.

In addition, reverse direction load flow per phase of the power transmitting direction is detected and out value DRA, DRB, DRC is outputted when the sum of 3 phase active power of the power transmitting direction is smaller than 0 and the instantaneous active power per phase of the power transmitting direction is higher than 0.

Further, when 3 phase active power of the power transmitting direction P34_20 is higher than 0, an out value P34R is outputted as 1 and when 3 phase active power of the power transmitting, receiving direction is equal to or smaller than 0, 0 is outputted.

Figure 44:
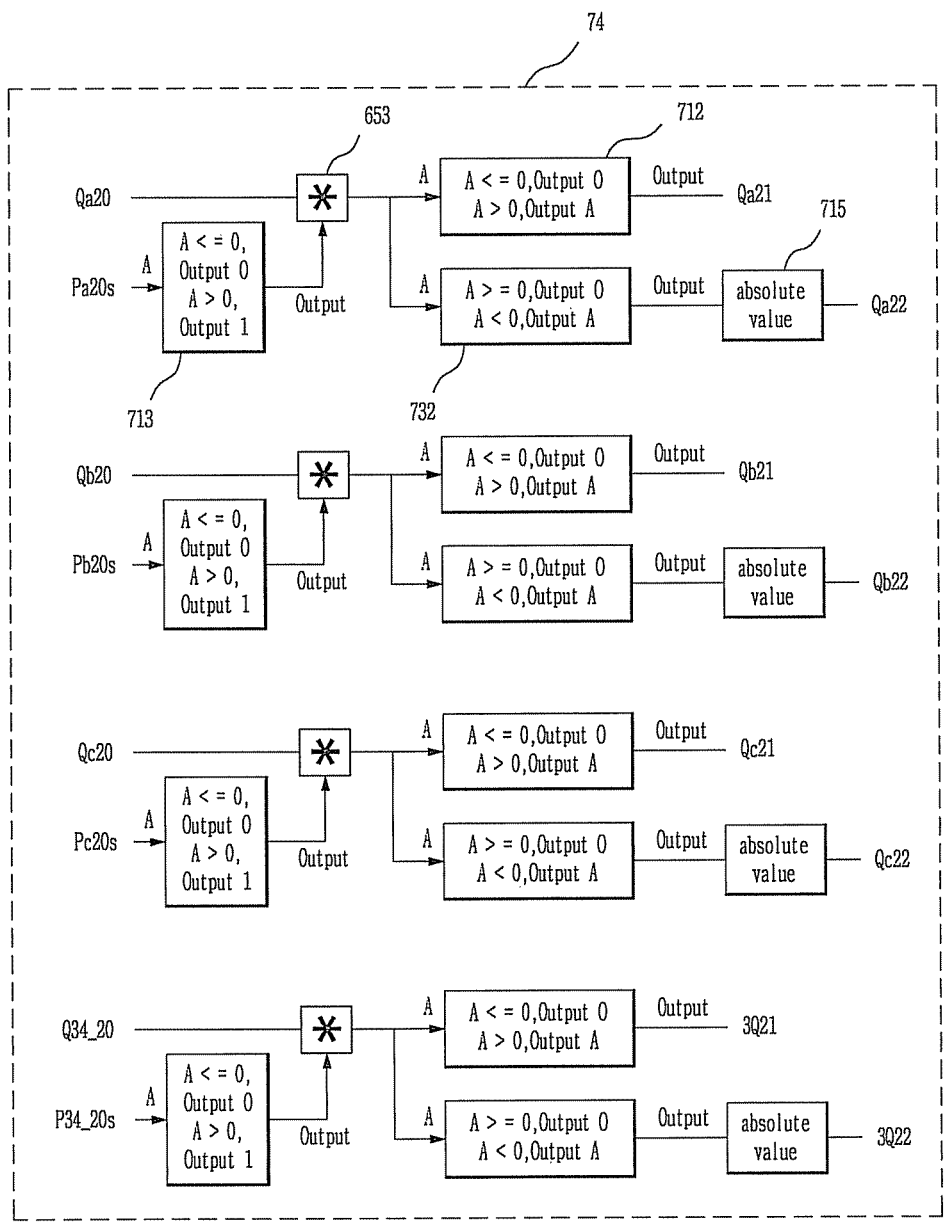

The power transmitting reactive power determining unit 74 may divide the outputted reactive power to lagging reactive power and leading reactive power. As shown in FIG. 44, the intensity selecting unit 712 selects lagging reactive power Qa21, Qb21, Qc21, 3Q21 if the compensated reactive power per phase and the compensated reactive power of 3 phase of the power transmitting direction Qa20, Qb20, Qc20, Q34_20 are higher than 0, and selects leading reactive power Qa22, Qb22, Qc22, 3Q22 if they are smaller than 0.

Figure 45:
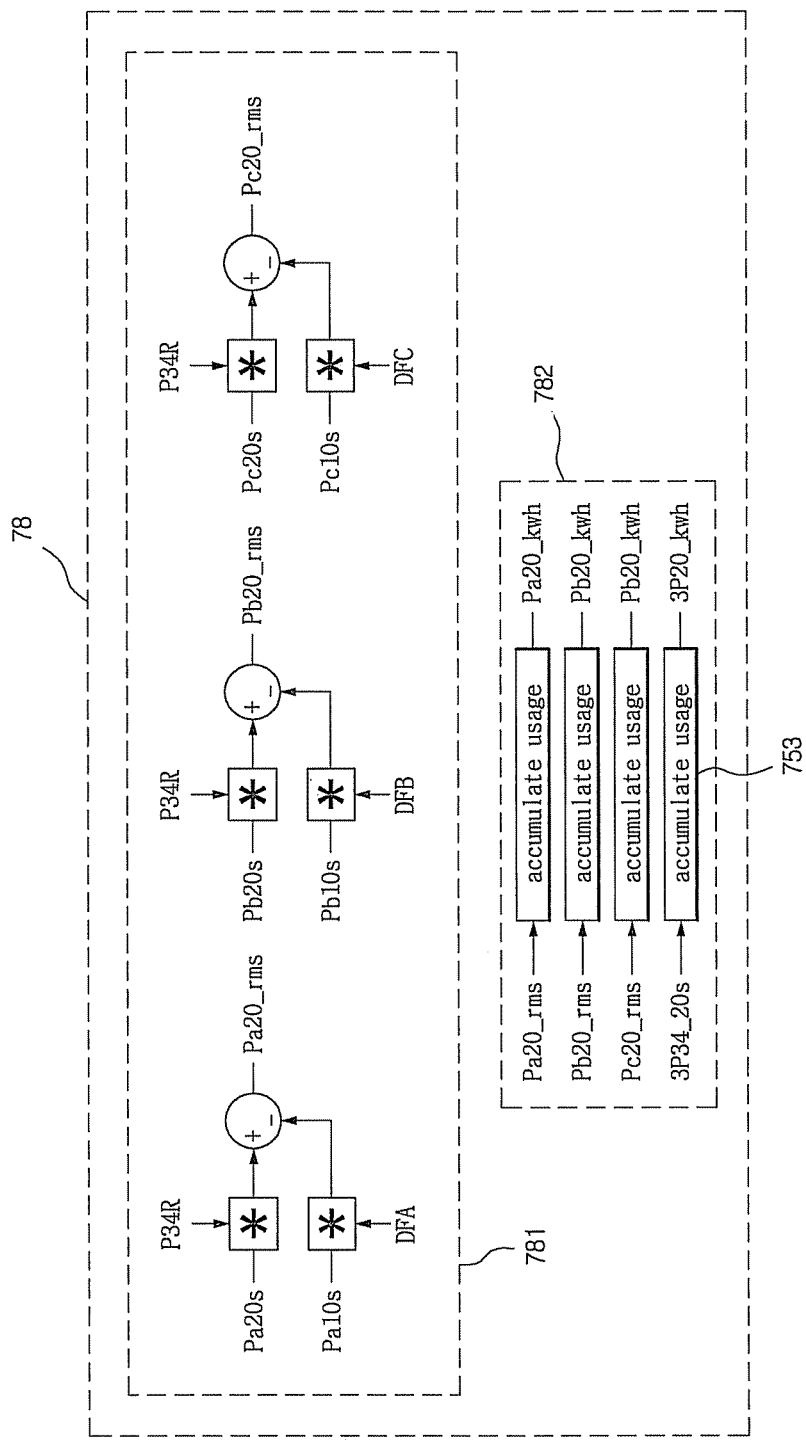
FIG. 45 is a block view illustrating an example of a power transmitting active power storing unit in FIG. 1.
Figure 46:
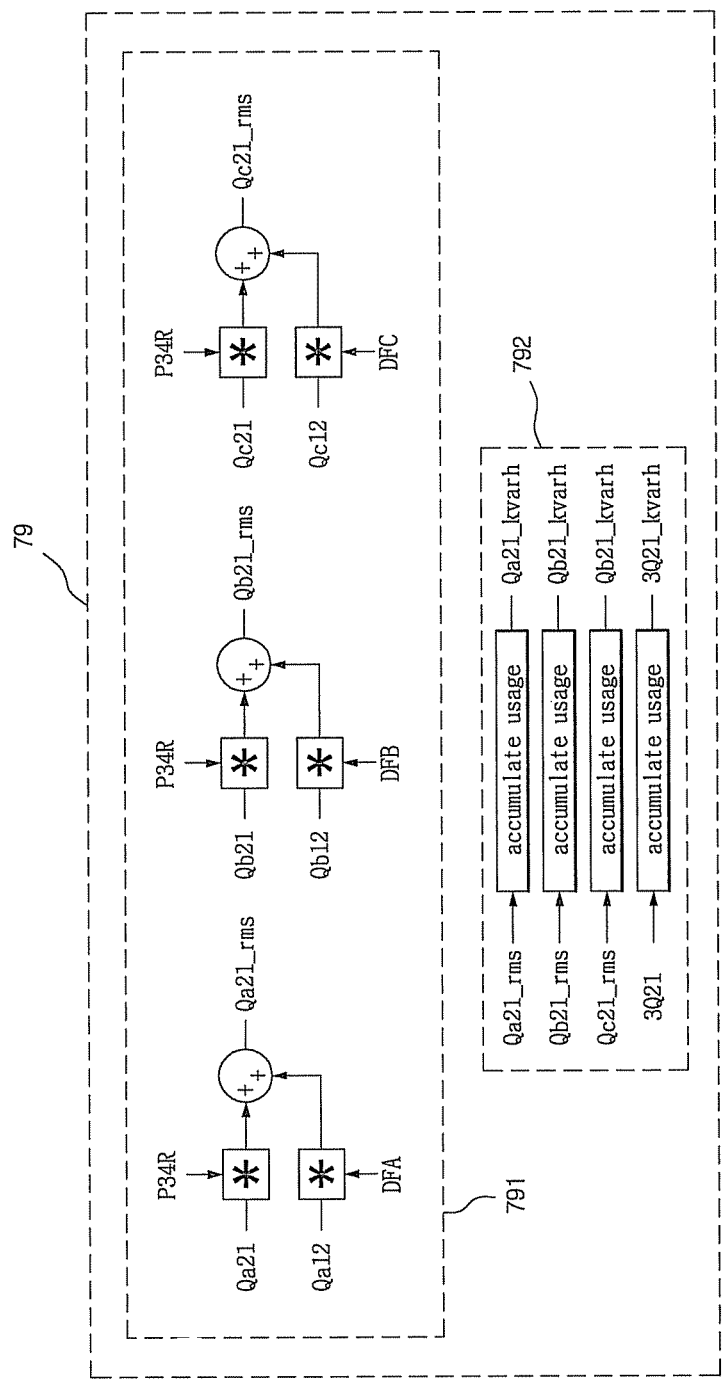
FIG. 46 is a block view illustrating an example of a power transmitting lagging reactive power storing unit in FIG. 1.
Figure 47:
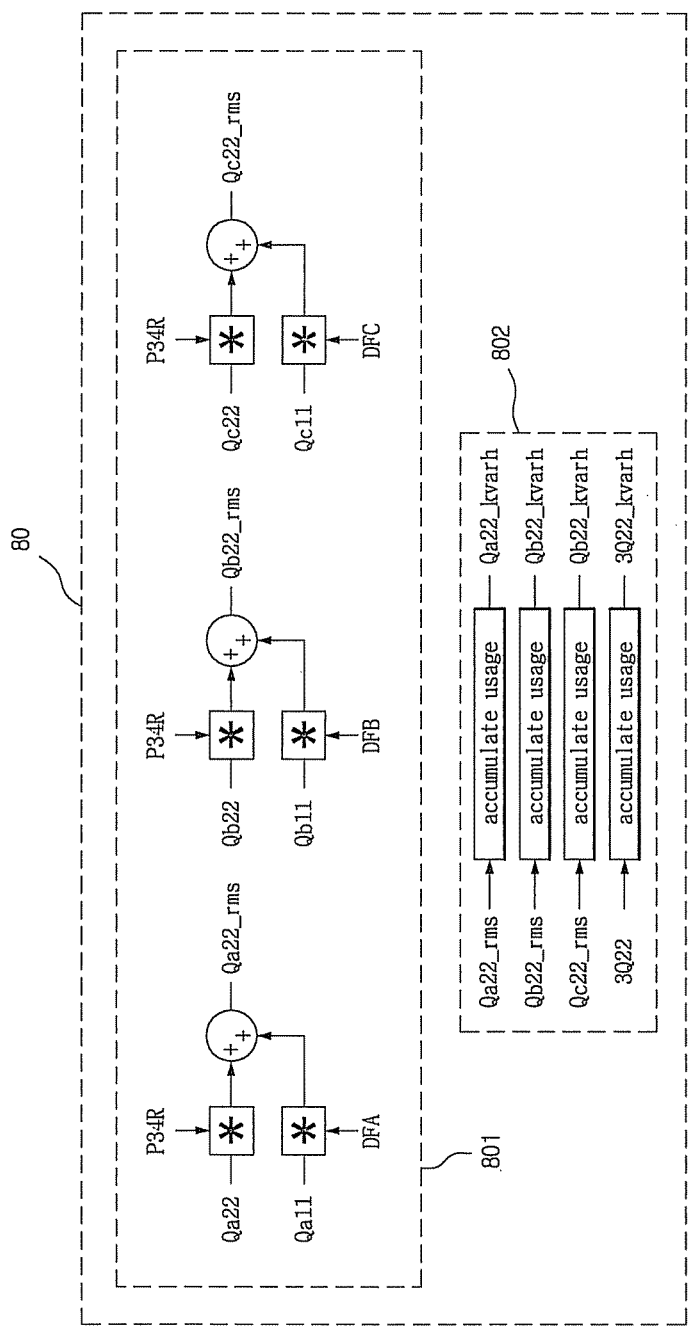
FIG. 47 is a block view illustrating an embodiment of a power transmitting leading reactive power storing unit in FIG. 1.

The power transmitting direction active power storing unit 78 illustrated in FIG. 45 performs the same function which the power receiving direction active power storing unit 75 does. The power receiving direction lagging reactive power storing unit 76 illustrated in FIG. 46 performs the same function which the power transmitting direction lagging reactive power storing unit 79 does. The power transmitting direction leading reactive power storing unit 80 illustrated in FIG. 47 performs the same function which the power receiving direction leading reactive power storing unit 77 does. Therefore, the overlapped description is omitted.

Figure 48:
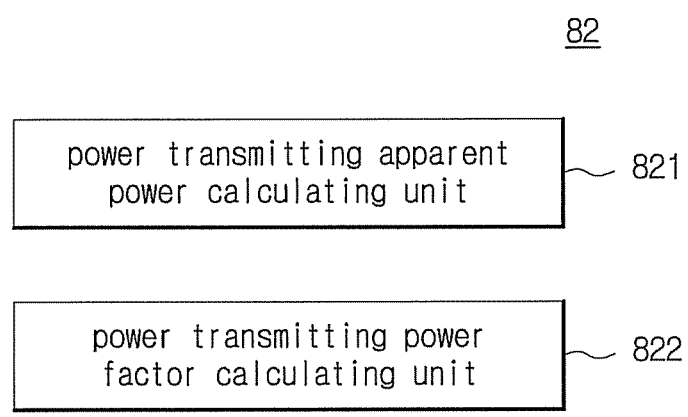
FIG. 48 to FIG. 50 are block view illustrating an embodiment of a power transmitting direction apparent power/power factor calculating unit.

A power transmitting apparent power/power factor calculating unit 82 may calculate apparent power and power factor and outputs the results. As shown in FIG. 48, the power transmitting apparent power/power factor calculating unit 82 may include a power transmitting apparent power calculating unit 821 and a power factor calculating unit 822, respectively.

Figure 49:
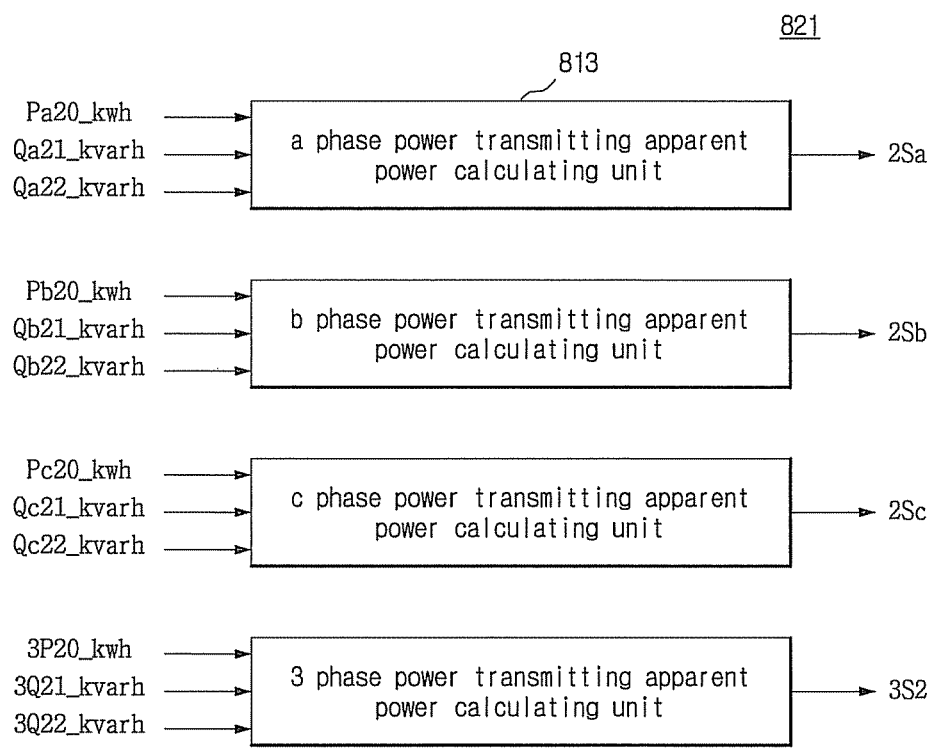

For example, as shown in FIG. 49, the power transmitting apparent power calculating unit 821 may calculate apparent power per phase and 3 phase power transmitting apparent power. Here, the power transmitting apparent power calculating unit 821 may calculate each apparent power per phase and amount of apparent power 2Sa, 2Sb, 2Sc, 3S2 by employing functions for calculating apparent power of Equation 33 to Equation 36 by using power transmitting RSM value-treated active power active power, lagging reactive power, leading reactive power and accumulated usage.

$$2Sa = \sqrt{Pa20_{kwh}^2 + (Qa21_{kvarh} + Qa22_{kvarh})^2} \qquad \text{Equation 33}$$

(wherein, Pa20 is active power of a phase, Qa21 is lagging active power of a phase, Qa22 is leading reactive power of a phase)

$$2Sb = \sqrt{P20_{kwh}^2 + (Qb21_{kvarh} + Qb22_{kvarh})^2} \qquad \text{Equation 34}$$

(wherein, Pa20 is active power of b phase, Qa21 is lagging reactive power of b phase, Qa22 is leading reactive power of b phase)

$$2Sc = \sqrt{Pc20_{kwh}^2 + (Qc21_{kvarh} + Qc22_{kvarh})^2} \qquad \text{Equation 35}$$

(wherein, Pc20 is active power of c phase, Qc21 is lagging reactive power of c phase, Qc22 is leading reactive power of c phase)

$$3S2 = \sqrt{3P20_{kwh}^2 + (3Q21_{kvarh} + 3Q22_{kvarh})^2} \qquad \text{Equation 36}$$

Figure 50:
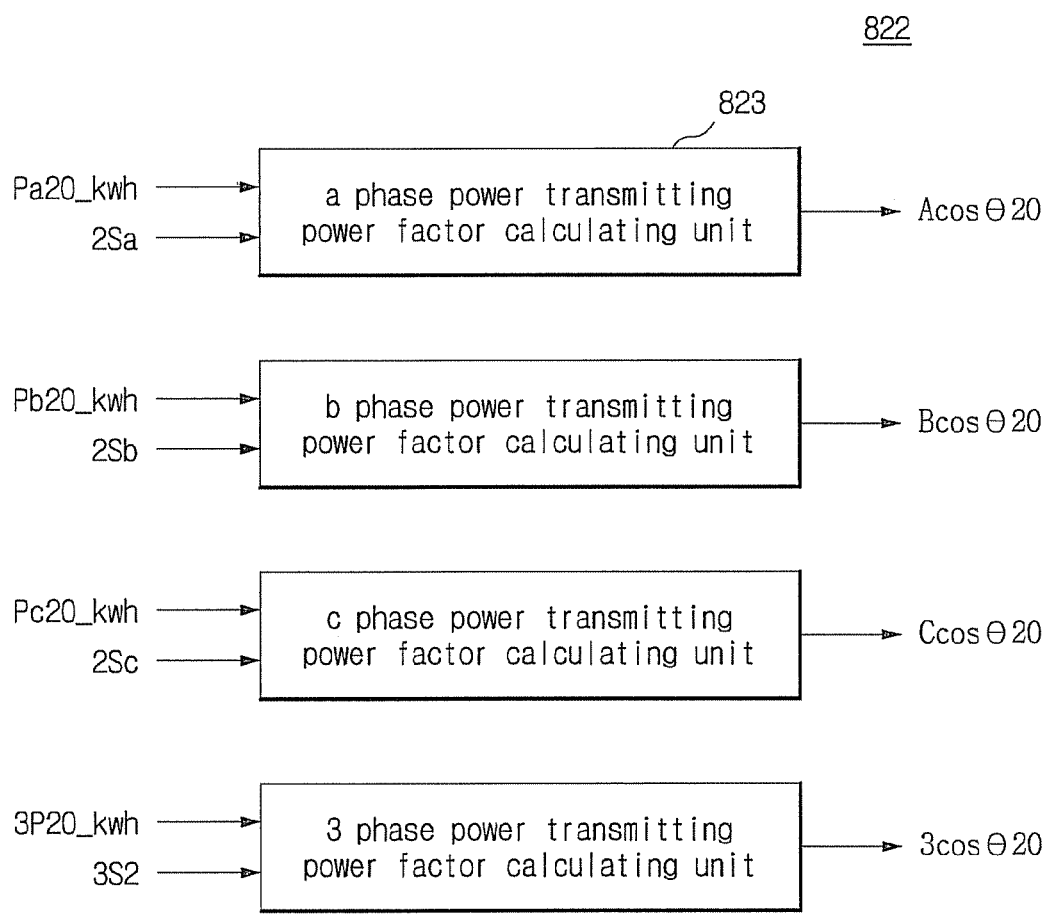

As shown in FIG. 50, the power transmitting power factor calculating unit 822 may calculate power transmitting power factor per phase and 3 phase power transmitting power factor by employing power factor calculating functions with using power transmitting active power and usage Pa20_kwh, Pb20_kwh, Pc20_kwh, 3P20_kwh and apparent power and apparent power usage 2Sa, 2Sb, 2Sc, 3S2.

Equation 37 to Equation 40 are equations for power transmitting power factors and 3 phase power transmitting power factors of a, b, and c phase.

$$A \cos \theta 20 = Pa20\_kwh/2Sa \qquad \text{Equation 37}$$

$$B \cos \theta 20 = Pb20\_kwh/2Sb \qquad \text{Equation 38}$$

$$C \cos \theta 20 = Pc20\_kwh/2Sc \qquad \text{Equation 39}$$

$$3 \cos \theta 20 = 3P20\_kwh/3S2 \qquad \text{Equation 40}$$

An active power zone which is power receiving reverse load flow compensated per phase according to an embodiment of the present invention has a single phase bidirectional calculating zone unlike a conventional one way type so that it allows calculating and compensating an intensity of reverse load flow per phase according to phase angle direction of reverse load flow per phase in real time and determining only actually used active power when reverse load flow occurs by a power system.

Particularly, since reactive power unlike active power has to determine lagging power and leading power during receiving power and transmitting power with a phase angle of 180°, an error in amount of reactive power may be severely caused according to phase when reverse load flow occurs.

A reactive power zone which is reverse load flow compensated per phase for receiving power compensates the same way as the active power compensation. Reactive power per phase is calculated and the result is compensated to actually used reactive power when reverse load flow occurs.

A calculating zone which is reverse load flow compensated for receiving power per phase may have a single phase bidirectional calculating zone type using 1, 2, 3, 4 quadrants unlike a conventional one way type using 1, 4 quadrants.

A 3 phase power calculating zone performs a 3 phase vector addition of instantaneous power compensated per phase. For example, a guideline for receiving power, which is reverse load flow compensated, compensates power actually used by a user per phase and determines the used amount even though phase angle per phase changes when reverse load flow occurs. Contrary to this, a guideline for transmitting power, which is reverse load flow compensated, does not determine the used amount in the direction of reverse load flow. A power receiving power meter and a power transmitting power meter, use identical calculation algorithm and a bidirectional power meter may be a one body combining the power receiving power meter and the power transmitting power meter.

Figure 51:
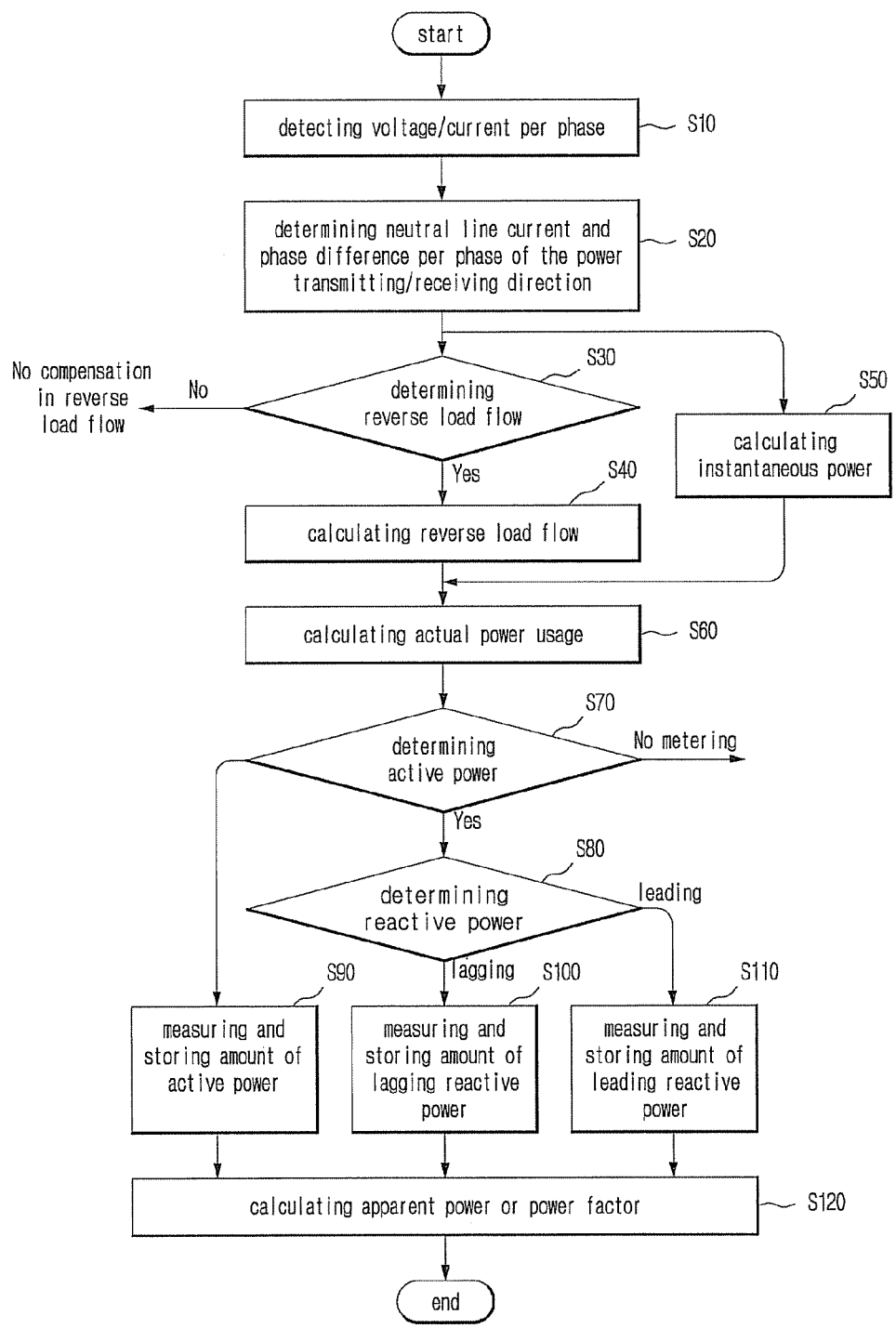
FIG. 51 is a flow chart illustrating a method for metering by a 3 phase bidirectional system for compensating reverse load flow according to an embodiment of the present invention.

FIG. 51 is a flow chart illustrating a method for metering by a 3 phase bidirectional system for compensating reverse load flow according to an embodiment of the present invention.

According to FIG. 51, a metering method by using a 3 phase bidirectional system for compensating reverse load flow according to an embodiment of the present invention may include: detecting voltage/current per phase (S10), determining neutral line current and phase difference per phase of the power transmitting/receiving direction (S20), determining reverse load flow (S30), calculating instantaneous power (S50), calculating reverse load flow (S40), calculating actual power usage (S60), determining active power (S70), determining reactive power (S80), measuring and storing amount of active power (S90), measuring and storing amount of lagging reactive power (S100), measuring and storing amount of leading reactive power (S110), and calculating apparent power or power factor (S120).

Voltage per phase or current per phase may be detected by using voltage value and current value inputted from a sensor (S10). Here, the sensor may include an instrument transformer and a current transformer.

Here, the detected voltage and current per phase may be converted to a discrete signal by sampling and the voltage and current per phase converted to a discrete signal may be further converted by the fast Fourier transform to divide to intensity per degree, phase per degree and DC component to calculate non-sinusoidal wave power.

The detected voltage value and current value is then used to determine neutral line current and each phase difference per phase of the power transmitting/receiving direction to determine power receiving direction and power transmitting direction (S20). Here, the power receiving direction may be determined by subtracting the phase of current per phase from the phase of voltage per phase and the power transmitting direction may be determined by adding 180° to the determined power receiving direction.

A neutral line current may be determined by calculating 3 phase current vector sum and may be determined by one chosen from the following methods: (i) dividing 3 phase current into a positive-sequence, a negative-sequence and a zero-sequence using the method of symmetrical coordinates; (ii) indirectly determining 3 phase current inside the power meter; and (iii) directly determining current of primary neutral line of an interconnection transformer.

Reverse load flow may be then determined by using the determined each phase difference per phase and neutral line current (S30). Here, if the intensity of zero-sequence is higher than that of negative-sequence by comparing the intensity of a fundamental component of negative-sequence and that of zero-sequence, 1 may be outputted, while 0 may be outputted if it is equal to or smaller. When 1 is outputted, it may be determined as occurrence of reverse load flow and when 0 is outputted, it may be determined as no occurrence of reverse load flow When reverse load flow occurs during the determining reverse load flow, reverse load flow power may be calculated (S40). Here, each of active power and reactive power of reverse load flow power is calculated. Here, each of active power and reactive power of reverse load flow of power receiving direction or power transmitting direction is calculated.

Instantaneous power may be calculated after determining bidirection (S50). Instantaneous power may be calculated by employing an instantaneous power calculating function using each current and phase difference per phase. Instantaneous power may be calculated by dividing into instantaneous active power and instantaneous reactive power. Instantaneous power may be calculated by employing Equations 1 to 12.

Actual power usage may be then calculated by calculating instantaneous compensation power per phase and 3 phase instantaneous compensation power using the instantaneous power and the reverse load flow power (S60). Here, compensated instantaneous power per phase and compensated 3 phase instantaneous power may be calculated at the direction selected from power receiving direction and power transmitting direction.

Here, each out value of power receiving compensated instantaneous active power per phase actually traded between a provider and a user may be calculated by using each function subtracting the reverse load flow instantaneous active power per phase from the power receiving instantaneous active power per phase.

For example, each out value of power receiving compensated instantaneous reactive power per phase actually traded between a provider and a user may be calculated by using each function subtracting the reverse load flow instantaneous reactive power per phase from the power receiving instantaneous reactive power per phase.

3 Phase power receiving instantaneous compensation active power may be calculated by performing vector addition of instantaneous power per phase compensated at the same point with a 3 terminal addition function to determine 3 phase active power. Further, 3 phase power receiving instantaneous compensation reactive power may be calculated by performing vector addition of reactive power per phase compensated at the same point with a 3 terminal addition function to determine 3 phase reactive power.

Power transmitting instantaneous active power, power transmitting instantaneous reactive power, and power transmitting 3 phase instantaneous power may be also calculated by the same method.

Active power of actual power usage may be then determined (S70). When active power of actual power usage is determined, instantaneous power per phase divided into the intensity and phase for each degree and DC component by employing the fast Fourier transform is added at the same point and then if the 3 phase added value is higher than 0, power per phase and 3 phase power is calculated by accumulating to the forward direction (power receiving). If the 3 phase added value is smaller than 0, power per phase and 3 phase power is calculated by accumulating to the reverse direction (power transmitting).

Reactive power of actual power usage may be then determined (S80). When active power of actual power usage is determined, reactive power per phase compensated at the same point per phase may be added. Here, if the outputted reactive power may be divided into lagging reactive power and leading reactive power. For example, if the power receiving direction compensated reactive power per phase and 3 phase reactive power is higher than 0, it selects lagging reactive power, while if it is smaller than 0, it selects leading reactive power. Power transmitting direction also uses the same method.

Power amount of active power or reactive power is measured according to the active power or the reactive power and stored the result (S90, S100, S110). Here, the reactive power may measure amount of lagging reactive power and amount of leading reactive power. Further, each amount of active power or reactive power for the power receiving direction or the power transmitting direction may be measured and stored. The power amount may be accumulated with time.

Apparent power or power factor is calculated by using the measured amount of active power or reactive power (S120). Apparent power may be calculated by employing Equation 19 to Equation 22 or Equation 33 to Equation 36 and power factor be calculated by employing Equation 19 to Equation 22 or Equation 23 to Equation 26 or Equation 37 to 40.

While it has been described with reference to particular embodiments, it is to be appreciated that various changes and modifications may be made by those skilled in the art without departing from the spirit and scope of the embodiment herein, as defined by the appended claims and their equivalents.

60: voltage per phase and current detecting unit
61: bidirectional measuring unit
62: power receiving instantaneous power calculating unit
63: power transmitting instantaneous power calculating unit
64: reverse load flow determining unit
65: power receiving reverse load flow calculating unit
66: power transmitting reverse load flow calculating unit
67: power receiving actual power usage calculating unit
68: power transmitting actual power usage calculating unit
69: power receiving direction selecting unit
70: power transmitting direction selecting unit
71: power receiving active power determining unit
72: power transmitting active power determining unit
73: power receiving reactive power determining unit
74: power transmitting reactive power determining unit
75: power receiving active power and usage
76: power receiving lagging reactive power and usage
77: power receiving leading reactive power and usage
78: power transmitting active power and usage
79: power transmitting lagging reactive power and usage
80: power transmitting leading reactive power and usage
81: power receiving apparent power and power factor calculating unit
82: power transmitting apparent power and power factor calculating unit

What is claimed is:

1. A bidirectional 3 phase power meter for compensating reverse load flow comprising:
   a voltage/current detecting unit detecting a voltage per phase or current per phase;
   a bidirectional measuring unit measuring power receiving direction or power transmitting direction by calculating phase difference per phase using the voltage per phase or current per phase value and calculating neutral line current;
   an instantaneous power calculating unit calculating instantaneous power by using the voltage per phase or current per phase and the phase difference per phase;
   a reverse load flow determining unit determining occurrence of reverse load flow through the phase difference per phase and the neutral line current calculated from the bidirectional measuring unit;
   a reverse load flow calculating unit calculating reverse load flow power generated when the reverse load flow determining unit determines occurrence of reverse load flow;
   an actual power usage calculating unit calculating actual power usage by calculating instantaneous compensation power per phase and 3 phase instantaneous compensation power using the instantaneous power and the reverse load flow power;
   a power transmitting/receiving direction determining unit determining active power or reactive power of the actual power usage;
   a power meter value storing unit compensating the amount of active power and reactive power calculated from the power transmitting/receiving direction determining unit and accumulating and storing the result; and
   an apparent power/power factor calculating unit calculating apparent power and power factor using the active power and reactive power stored at the power meter value storing unit and the amount of accumulated power,
   wherein the reverse load flow determining unit further comprises:
   a negative-sequence selecting unit selecting a negative-sequence from a positive-sequence and a negative-sequence;
   a current intensity comparing unit comparing a negative-sequence intensity outputted from the negative-sequence selecting unit with a zero-sequence intensity;
   a plurality of voltage phase difference comparing units comparing phase difference of voltages per phase;
   a first AND gate comparing outputs of the voltage phase difference comparing units; and
   a second AND gate comparing outputs of the current intensity comparing unit and the first AND gate.

2. The bidirectional 3 phase power meter for compensating reverse load flow of claim 1, wherein the bidirectional measuring unit further comprises a power receiving direction measuring unit; and a power transmitting direction measuring unit, in which the power receiving direction measuring unit determines phase by subtracting the phase of the current per phase from the phase of the voltage per phase and the power transmitting direction measuring unit determines phase by adding 180° to the phase determined at the power receiving direction measuring unit.

3. The bidirectional 3 phase power meter for compensating reverse load flow of claim 2, wherein the bidirectional measuring unit further comprises a neutral line current measuring unit determining the neutral line current by calculating 3 phase current vector sum.

4. The bidirectional 3 phase power meter for compensating reverse load flow of claim 1, wherein the instantaneous power calculating unit further comprises a power receiving instantaneous power calculating unit calculating power receiving direction instantaneous power; and a power transmitting instantaneous power calculating unit calculating power transmitting direction instantaneous power.

5. The bidirectional 3 phase power meter for compensating reverse load flow of claim 4, wherein the power receiving instantaneous power calculating unit further comprises an instantaneous active power calculating unit calculating instantaneous active power per phase; and an instantaneous reactive power calculating unit calculating instantaneous reactive power per phase.

6. The bidirectional 3 phase power meter for compensating reverse load flow of claim 1, wherein
the current intensity comparing unit outputs 0 or 1 as a result of comparing the negative-sequence intensity outputted from the negative-sequence selecting unit with a zero-sequence intensity,
the plurality of voltage phase difference comparing units outputs 0 or 1 as a result of comparing the phase difference of voltages per phase;
the first AND gate outputs 1 in the case in which all the outputs of the voltage phase difference comparing unit are 1 and outputs 0 in the rest of the cases; and
the second AND gate outputs 1 in the case in which all the outputs of the current intensity comparing unit and the first AND gate are 1.

7. The bidirectional 3 phase power meter for compensating reverse load flow of claim 1, wherein the reverse load flow calculating unit further comprises:
a power receiving reverse load flow calculating unit calculating power receiving direction reverse load flow power; and
a power transmitting reverse load flow calculating unit calculating power transmitting direction reverse load flow power.

8. The bidirectional 3 phase power meter for compensating reverse load flow of claim 1, wherein the reverse load flow calculating unit further comprises:
an active reverse load flow calculating unit calculating active power of the reverse load flow power per phase; and
a reactive reverse load flow calculating unit calculating reactive power of the reverse load flow power per phase.

9. The bidirectional 3 phase power meter for compensating reverse load flow of claim 1, wherein the power meter value storing unit further comprises a power usage integrating unit integrating active power or reactive power selected from the power transmitting/receiving direction determining unit with time.

10. A bidirectional 3 phase power meter for compensating reverse load flow comprising:
a voltage/current detecting unit detecting a voltage per phase or current per phase;
a bidirectional measuring unit measuring power receiving direction or power transmitting direction by calculating phase difference per phase using the voltage per phase or current per phase value and calculating neutral line current;
an instantaneous power calculating unit calculating instantaneous power by using the voltage per phase or current per phase and the phase difference per phase;
a reverse load flow determining unit determining occurrence of reverse load flow through the phase difference per phase and the neutral line current calculated from the bidirectional measuring unit;
a reverse load flow calculating unit calculating reverse load flow power generated when the reverse load flow determining unit determines occurrence of reverse load flow;
an actual power usage calculating unit calculating actual power usage by calculating instantaneous compensation power per phase and 3 phase instantaneous compensation power using the instantaneous power and the reverse load flow power;
a power transmitting/receiving direction determining unit determining active power or reactive power of the actual power usage;
a power meter value storing unit compensating the amount of active power and reactive power calculated from the power transmitting/receiving direction determining unit and accumulating and storing the result; and
an apparent power/power factor calculating unit calculating apparent power and power factor using the active power and reactive power stored at the power meter value storing unit and the amount of accumulated power,
the actual power usage calculating unit further comprising:
a power receiving actual power usage calculating unit calculating power receiving direction instantaneous compensation power per phase and 3 phase instantaneous compensation power; and
a power transmitting actual power usage calculating unit calculating power transmitting direction instantaneous compensation power per phase and 3 phase instantaneous compensation power,
wherein the power receiving actual power usage calculating unit or the power transmitting actual power usage calculating unit further comprises:
an instantaneous compensation active power per phase calculating unit calculating instantaneous compensation active power per phase;
an instantaneous compensation reactive power per phase calculating unit calculating instantaneous compensation reactive power per phase;
a 3 phase instantaneous compensation active power calculating unit calculating instantaneous compensation active power of 3 phase; and
a 3 phase instantaneous compensation reactive power calculating unit calculating instantaneous compensation reactive power of 3 phase,
wherein the power transmitting/receiving direction determining unit further comprises an active power determining unit determining active power of the actual power usage of the power transmitting direction or power receiving direction, and a reactive power determining unit determining reactive power of the actual power usage,
and wherein the active power determining unit outputs 0 if the sum of each compensated active power value per phase and compensated 3 phase active power value is equal to or smaller than 0, and outputs the sum of each compensated active power value per phase and the compensated 3 phase active power value if the sum of each compensated active power value and compensated 3 phase active power value is higher than 0.

11. The bidirectional 3 phase power meter for compensating reverse load flow of claim 10, wherein the instantaneous compensation active power per phase calculating unit calculates a compensation value by subtracting reverse load flow instantaneous active power per phase from instantaneous active power per phase.

12. The bidirectional 3 phase power meter for compensating reverse load flow of claim 10, wherein the instantaneous compensation reactive power per phase calculating unit calculates a compensation value by subtracting reverse load flow instantaneous reactive power per phase from instantaneous reactive power per phase.

13. The bidirectional 3 phase power meter for compensating reverse load flow of claim 10, wherein the 3 phase instantaneous compensation active power calculating unit calculates vector sum of instantaneous active power per phase compensated at the same point per phase.

14. The bidirectional 3 phase power meter for compensating reverse load flow of claim 10, wherein the 3 phase instantaneous compensation reactive power calculating unit calculates vector sum of instantaneous reactive power per phase compensated at the same point per phase.

15. The bidirectional 3 phase power meter for compensating reverse load flow of claim 10, wherein the active power determining unit outputs an output value if the sum of 3 phase active power values is smaller than 0 and the sum of active power values per phase is higher than 0.

16. The bidirectional 3 phase power meter for compensating reverse load flow of claim 10, wherein the reactive power determining unit determines a reactive power value if a compensation active power value per phase is higher than 0 and active power of the power receiving direction is determined, and outputs 0 for a reactive power value if an active power value is smaller than 0 based on the compensation active power value per phase.

17. The bidirectional 3 phase power meter for compensating reverse load flow of claim 16, wherein the reactive power determining unit determines lagging reactive power or leading reactive power, in which it selects the lagging reactive power if the compensated reactive power per phase and 3 phase reactive power is higher than 0 and it does the leading reactive power if it is smaller than 0.

18. A method for metering by using a 3 phase bidirectional power meter for compensating reverse load flow, comprising:
    (a) detecting voltage or current per phase by using voltage value and current value inputted from a sensor;
    (b) measuring neutral line current and each phase difference per phase of power transmitting/receiving direction by using the detected voltage value and current value;
    (c) determining reverse load flow by using the measured each phase difference per phase and the neutral line current;
    (d) calculating reverse load flow power when it is determined for the occurrence of the reverse load flow;
    (e) calculating instantaneous power by employing an instantaneous power calculating function of the each voltage per phase, the each current per phase and the phase difference;
    (f) calculating actual power usage by calculating instantaneous compensation power per phase and 3 phase instantaneous compensation power through the instantaneous power and the reverse load flow power;
    (g) determining active power of the actual power usage;
    (h) determining reactive power of the actual power usage;
    (i) measuring and storing amount of active power or reactive power according to the result determined by the active power or reactive power; and
    (j) calculating apparent power or power factor using the measured active power or reactive power amount,
    wherein the step (c) comprises outputting 1 if the zero-sequence is higher than the negative-sequence when intensity of the negative-sequence is compared with that of the zero-sequence and outputting 0 if it is equal to or smaller.

19. The method of claim 18, wherein the step (b) comprises determining power receiving direction by subtracting the phase of the current per phase from the phase of the voltage per phase; and determining power transmitting direction by adding 180° to the determined power receiving direction.

20. The method of claim 18, wherein the step (b) comprises determining the neutral line current by calculating 3 phase current vector sum.

21. The method of claim 18, wherein the step (a) further comprises transforming into discrete signal by sampling the detected voltage and the current per phase; and calculating non-sinusoidal wave power by dividing the voltage per phase and current per phase transformed into the discrete signal, into the intensity and phase for each degree and DC component by employing the fast Fourier transform.

22. The method of claim 21, wherein the step (g) further comprises
    In the step of (g), per-phase instantaneous powers at a same point are added, and if the three-phase-added value is greater than 0, the power per phase and three-phase power can be accumulated in a power-receiving direction furthermore, if the three-phase-added value is less than 0, the power per phase and three-phase power can be accumulated in a power-transmitting direction.

23. The method of claim 22, wherein the step (h) further comprises adding reactive power per phase compensated at the same point per phase.

24. The method of claim 22, wherein the step (h) further comprises determining as lagging reactive power, if the compensated instantaneous reactive power per phase and the compensated 3 phase reactive power is higher than 0 and determining as leading reactive power if it is smaller than 0.

25. The method of claim 18, wherein the step (i) further comprises storing each of the compensated active power and reactive power according to power receiving direction and power transmitting direction.

\* \* \* \* \*